United States Patent
Frederick

(10) Patent No.: US 10,205,622 B2
(45) Date of Patent: Feb. 12, 2019

(54) WAVEFORM SYNTHESIS FOR RFID TRANSMITTERS

(71) Applicant: Clairvoyant Technology LLC, Chapel Hill, NC (US)

(72) Inventor: Thomas Frederick, Chapel Hill, NC (US)

(73) Assignee: CLAIRVOYANT TECHNOLOGY LLC, Durham, NC (US)

( * ) Notice: Subject to any disclaimer, the term of this patent is extended or adjusted under 35 U.S.C. 154(b) by 119 days.

(21) Appl. No.: 15/037,205

(22) PCT Filed: Dec. 13, 2013

(86) PCT No.: PCT/US2013/074897
§ 371 (c)(1),
(2) Date: May 17, 2016

(87) PCT Pub. No.: WO2015/088547
PCT Pub. Date: Jun. 18, 2015

(65) Prior Publication Data
US 2016/0294601 A1 Oct. 6, 2016
US 2018/0041372 A9 Feb. 8, 2018

(51) Int. Cl.
*H04L 27/36* (2006.01)
*H04W 4/80* (2018.01)
(Continued)

(52) U.S. Cl.
CPC ........ *H04L 27/367* (2013.01); *G06K 7/10009* (2013.01); *G06K 7/10297* (2013.01);
(Continued)

(58) Field of Classification Search
CPC ..... H04L 27/18; H04L 43/028; H04L 27/366; H04L 27/04; H04L 27/06; H04B 1/59;
(Continued)

(56) References Cited

U.S. PATENT DOCUMENTS 7,049,964 B2 * 5/2006 Hyde ................... G06K 7/0008
340/10.1
7,126,999 B2 10/2006 Dent
(Continued)

OTHER PUBLICATIONS

Clairvoyant Technology LLC; International Search Report and Written Opinion for International Application No. PCT/US2013/074897 dated Mar. 19, 2014, 19 pages.

*Primary Examiner* — Jean B Corrielus
(74) *Attorney, Agent, or Firm* — Kilpatrick Townsend & Stockton LLP

(57) ABSTRACT

A waveform synthesis technique for radio frequency identification (RFID) transmitters and an RFID system making us of the technique are disclosed. The RFID transmitter in example embodiments synthesizes a continuous transmitter waveform from a symbol alphabet without Nyquist or interpolation filters. High spectral occupancy waveforms are achieved which include the ability to do both linear and nonlinear predistortion with no increase in computational load once the signal set has been adapted to compensate for linear and nonlinear distortion in the transmitter analog circuitry. A polarity generator can be used to impart the required polarity to each waveform. The RFID transmitter can be employed in RFID readers to reduce the computational requirements of the digital signal processor (DSP).

23 Claims, 19 Drawing Sheets

(51) Int. Cl.

| | | |
|---|---|---|
| *H04L 27/04* | (2006.01) | |
| *H04L 27/06* | (2006.01) | |
| *H04B 5/00* | (2006.01) | |
| *H04L 27/18* | (2006.01) | |
| *H04L 12/26* | (2006.01) | |
| *G06K 7/10* | (2006.01) | |
| *H04W 4/35* | (2018.01) | |
| *H03C 5/00* | (2006.01) | |
| *H03F 1/32* | (2006.01) | |
| *G06K 19/07* | (2006.01) | |
| *H04B 1/04* | (2006.01) | |
| *H03C 1/00* | (2006.01) | |
| *H04B 1/59* | (2006.01) | |

(52) U.S. Cl.
CPC ............ *H03C 5/00* (2013.01); *H03F 1/3241* (2013.01); *H04B 5/0062* (2013.01); *H04L 27/04* (2013.01); *H04L 27/06* (2013.01); *H04L 27/18* (2013.01); *H04L 43/028* (2013.01); *H04W 4/35* (2018.02); *H04W 4/80* (2018.02); *G06K 19/0723* (2013.01); *H03C 1/00* (2013.01); *H04B 1/59* (2013.01); *H04B 5/00* (2013.01); *H04B 2001/0425* (2013.01); *H04L 27/366* (2013.01)

(58) Field of Classification Search
CPC .................... H04B 5/0062; H04B 5/00; H04B 2001/0425; G06K 7/10009; G06K 19/0723; H03C 1/00; H04W 4/008
See application file for complete search history.

(56) References Cited

U.S. PATENT DOCUMENTS

| | | | |
|---|---|---|---|
| 8,301,086 B2 | 10/2012 | Groe et al. | |
| 8,827,153 B1 * | 9/2014 | Rhoades | G06K 19/06206 235/380 |
| 2005/0065901 A1 | 3/2005 | Diong | |
| 2008/0197982 A1 * | 8/2008 | Sadr | H03M 13/2957 340/10.4 |
| 2008/0278293 A1 * | 11/2008 | Drucker | G06K 7/0008 340/10.4 |
| 2008/0297309 A1 | 12/2008 | Loyer | |
| 2013/0168534 A1 | 7/2013 | Burr et al. | |
| 2013/0240757 A1 | 9/2013 | Einziger et al. | |

* cited by examiner

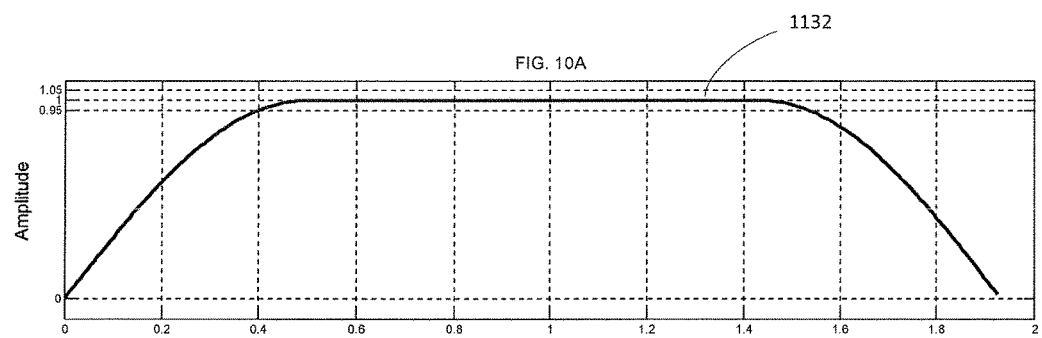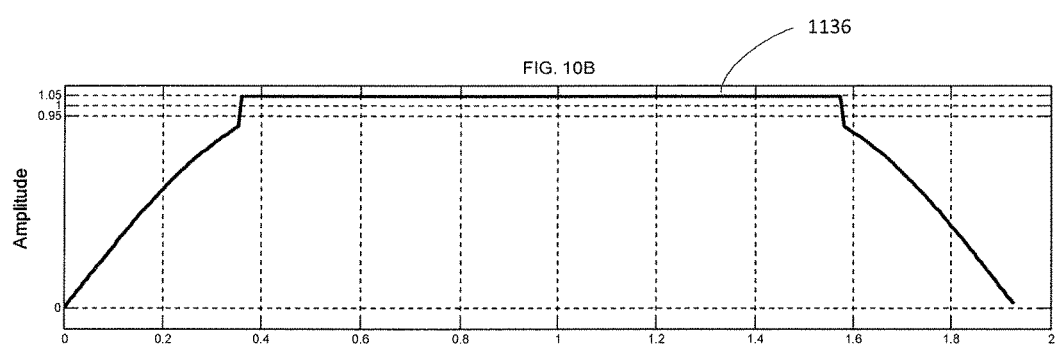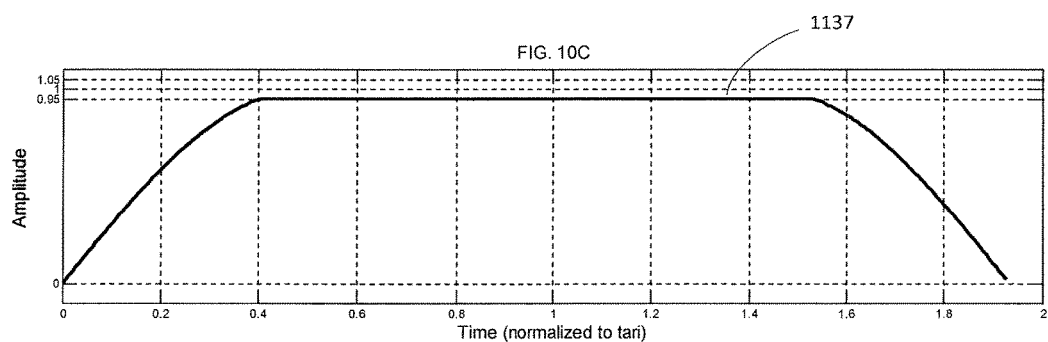

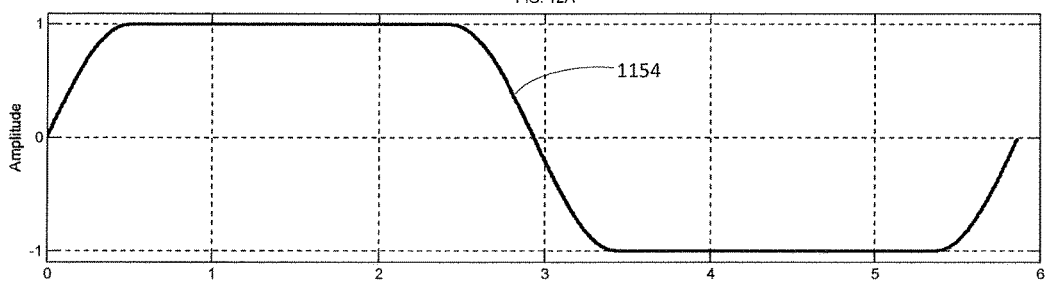
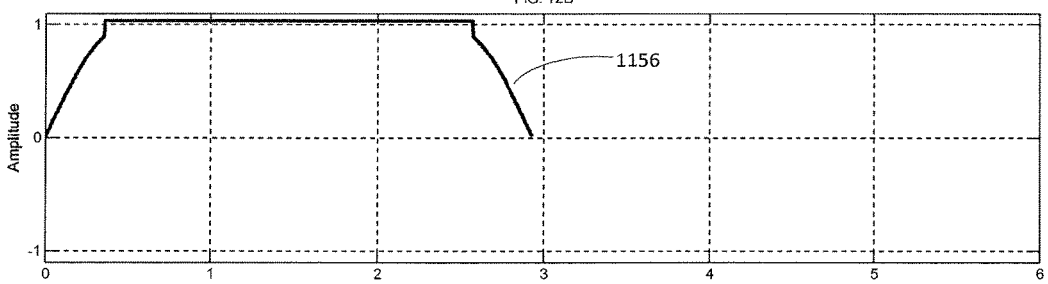
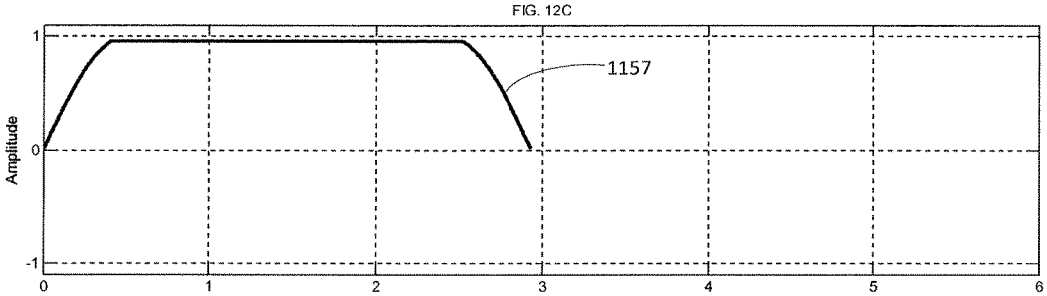
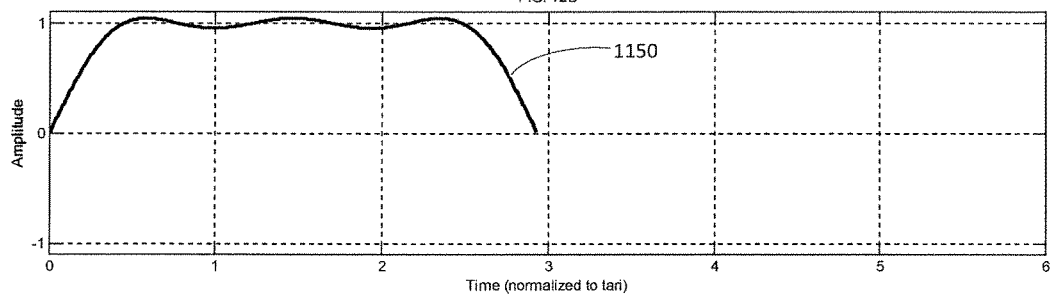

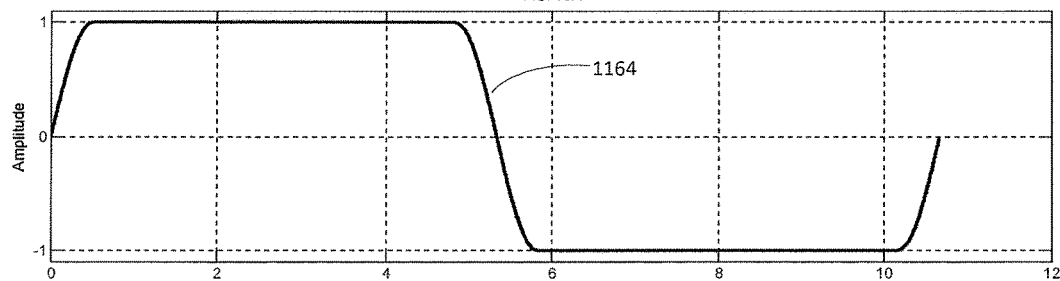
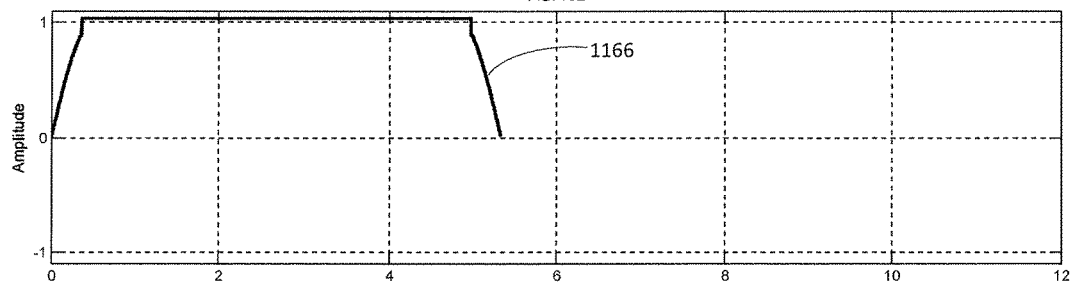
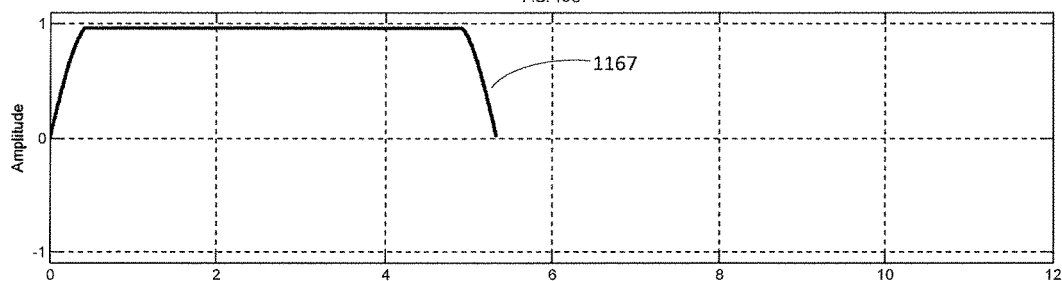
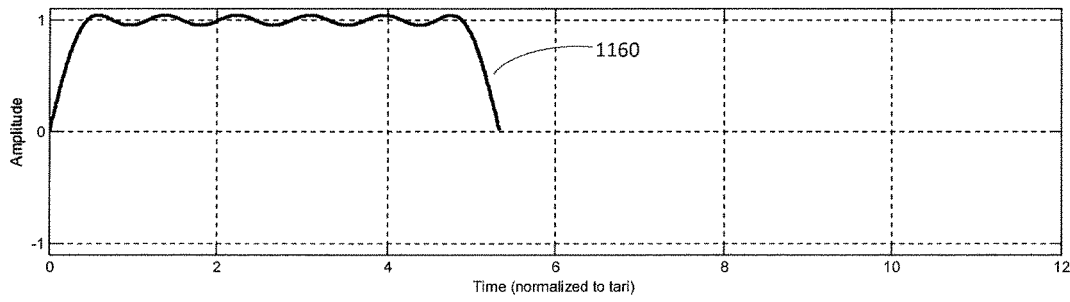

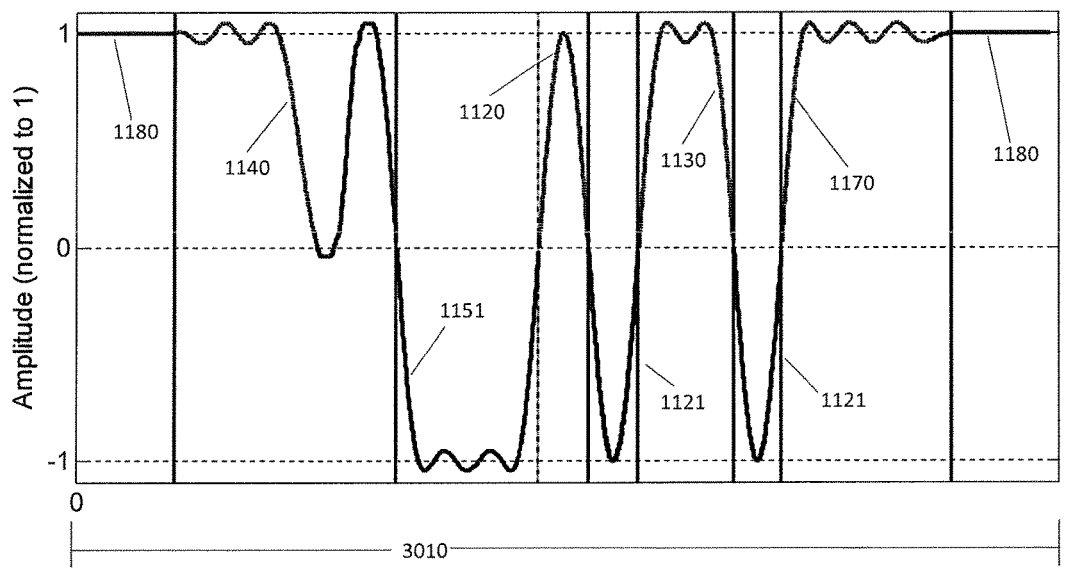
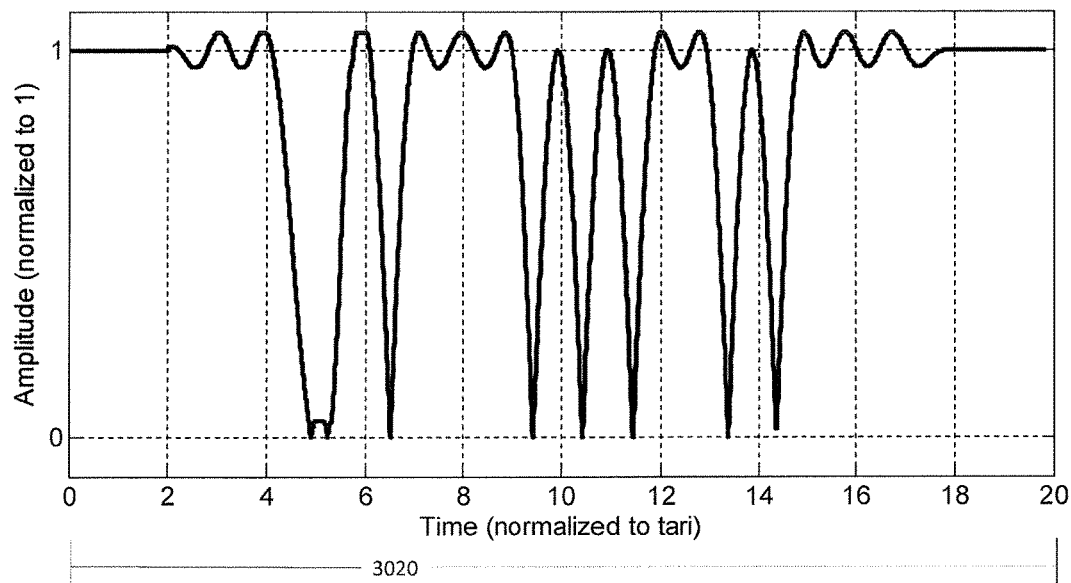

WAVEFORM SYNTHESIS FOR RFID TRANSMITTERS

CROSS-REFERENCE TO RELATED APPLICATION

This application claims the benefit of International Application No. PCT/US2013/074897, filed on Dec. 13, 2013, which is incorporated herein by reference in its entirety.

BACKGROUND ART

The Gen2 RFID protocol includes a challenging combination of time domain and frequency domain specifications for the reader's modulation. The time domain requirements specify maximum rise and fall times, minimum modulation depth, and maximum ripple of the signal envelope, while the frequency domain requirements specify limits on adjacent channel power ratios. Conventional Nyquist and interpolation filtering has limitations in meeting these specifications. Nyquist and interpolation filtering is also computationally expensive, especially when combined with conventional linear and nonlinear predistortion.

DISCLOSURE OF EMBODIMENTS OF THE INVENTION

Embodiments of the present invention provide apparatus and methods for generating amplitude modulated transmission signals in an RFID reader. The apparatus according to embodiments of the invention can perform waveform synthesis, linear predistortion, and nonlinear predistortion. The transmit signal synthesis may be used for pulse interval encoding or Manchester encoding. The transmit signal synthesis can be employed for suppressed carrier amplitude modulation or large carrier amplitude modulation, also referred to as PR-ASK and DSB-ASK in the ISO 18000-63 protocol specification. The transmit signal synthesis can support both direct conversion radio architecture and polar modulation architectures.

A radio frequency identification (RFID) system according to at least some embodiments of the invention includes a storage medium in which a plurality of waveforms is stored, for example, in computed table format. Each stored waveform represents an RFID symbol usable in a sequence of RFID symbols. A polarity generator can be used to selectively impart a required polarity to each stored waveform to assemble such a sequence of RFID symbols. The RFID system can also include an RF source to produce a carrier wave, and an RF amplifier connected to the RF source and the polarity generator for transmitting the sequence of RFID symbols modulated onto the carrier wave in order to synthesize the RFID transmitter waveform.

In some embodiments, the stored waveforms include linear and/or nonlinear predistortion that has been applied to substantially undistorted waveforms. In some embodiments, the stored waveforms are represented in Cartesian coordinates for use in a direct conversion transmitter. Such a transmitter can include a modulator connected to the polarity generator, an RF source and an RF amplifier to form the direct conversion transmitter and produce the RFID transmitter waveform as an amplitude modulated RF signal.

In some embodiments of the invention, the stored waveforms are represented in polar coordinates for use in a polar modulation transmitter. Such a transmitter can include a phase shifter connected to the polarity generator, the RF source and the RF amplifier to form the polar modulation transmitter and produce the RFID transmitter waveform.

The RFID system of at least some embodiments uses RFID symbols where the data-1 interval has a length from about 1.8 to about 1.95 Type-A reference interval (tari). In some embodiments, the data-1 interval has a length of about 1.933 tari. The system can use a carrier with a frequency selected from HF, UHF or microwave frequency bands. The system can use a processor to retrieve the stored waveforms from a plurality of stored waveforms and imparting a polarity to each stored waveform wherein the polarity is selectively set based on the RFID symbol represented. The processor then assembles a sequence of RFID symbols each based on the corresponding stored waveform and the selectively set polarity. The processor, together with a computer usable storage medium, such as a memory to store waveforms and executable computer program code or firmware, can be used as the means to carry out the transmitter synthesis technique.

The run time waveforms used with embodiments of the invention can be obtained by assembling a prototype waveform for each symbol using sinusoidal rising and falling edges and creating lower and upper bounds for the prototype waveform so that rise and fall times are preserved. A quarter wave symmetric periodic waveform is constructed from the prototype waveform, and an optimization algorithm using the quarter wave symmetric periodic waveform can be used to extract the run time waveform. Linear and/or nonlinear predistortion can also be applied to the run time waveform. In some embodiments, overshoot and ripple are added to the symmetric periodic waveform prior to executing the optimization algorithm. In some embodiments, the optimization algorithm used is a quadratic programming algorithm and in some embodiments, the algorithm uses a discrete Fourier transform. In some embodiments, the optimization procedure of the algorithm minimizes spectral occupancy.

BRIEF DESCRIPTION OF THE DRAWINGS

FIG. 10 is a plot of the prototype data-1 waveform together with upper and lower bounds for the optimization process according to some embodiments of the invention. FIG. 10 is presented in three parts as FIGS. 10A, 10B and 10C.

FIG. 11 is presented in four parts as FIGS. 11A, 11B, 11C and 11D.

FIG. 12 is a plot of the RTCAL waveform result of quadratic programming optimization using the discrete Fourier transform to compute harmonic energy which is to be minimized. FIG. 12 is presented in four parts as FIGS. 12A, 12B, 12C and 12D.

FIG. 13 is a plot of the TRCAL waveform result of quadratic programming optimization using the discrete Fourier transform to compute harmonic energy which is to be minimized. FIG. 13 is presented in four parts as FIGS. 13A, 13B, 13C and 13D.

FIG. 14 is presented in four parts as FIGS. 14A, 14B, 14C and 14D.

FIG. 15 is presented in four parts as FIGS. 15A, 15B, 15C and 15D.

FIG. 16 is a plot of an example Gen2 command using the disclosed transmit waveform synthesis technique of some embodiments of the invention. FIG. 16 is presented in two parts as FIG. 16A and FIG. 16B.

BEST MODES FOR CARRYING OUT THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Like numbers refer to like elements throughout.

Terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" or "comprising," when used in this specification, specify the presence of stated features, steps, operations, elements, or components, but do not preclude the presence or addition of one or more other features, steps, operations, elements, components, or groups thereof. Additionally, comparative, quantitative terms such as "above", "below", "less", "more", are intended to encompass the concept of equality, thus, "less" can mean not only "less" in the strictest mathematical sense, but also, "less than or equal to."

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. It will also be understood that when an element is referred to as being "connected" or "coupled" to another element, it can be directly connected or coupled to the other element or intervening elements may be present.

Figure 1:
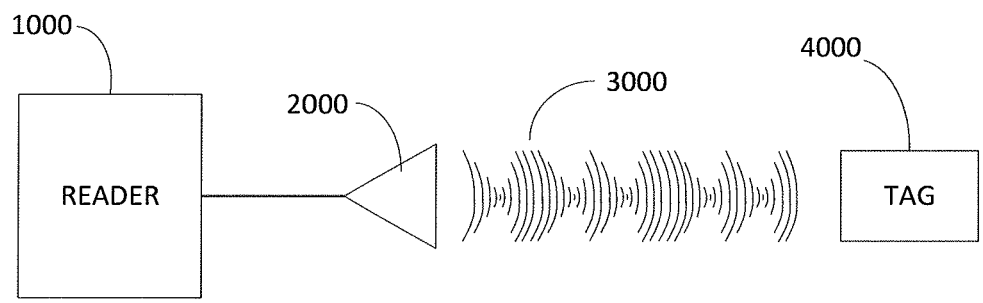
FIG. 1 is a functional block diagram of an example operating environment for an RFID system with an amplitude modulated reader-to-tag communications link.

A block diagram of the operating environment of an example RFID reader 1000 using amplitude modulated reader-to-tag link communications 3000 is shown in FIG. 1. The reader 1000 is connected to one or more antennas 2000, which radiate the modulated transmit signal 3000 to one or more tags 4000. Some types of RFID tags decode commands from the reader which are encoded in the amplitude modulation of the reader's RF carrier signal. In some cases the modulation depth of the reader's RF carrier is specified to be from 80% to 100%. Furthermore, in some cases the time domain specifications on the amplitude modulation are tightly constrained so that using a conventional Nyquist pulse shaping filter makes it difficult to simultaneously meet time domain and frequency domain specifications. One example of this is the ISO 18000-63 protocol, also informally known as "Gen2".

As with many other digital signaling techniques, RFID information is represented in data-1 and data-0 intervals. Gen2 encodes commands to the tags using pulse interval encoding (PIE). In PIE, the information is contained in the time interval between pulses. For Gen2, the protocol uses a short pulse interval for a data-0 and a longer pulse interval for a data-1. Still longer intervals are used for other special symbols known in the protocol as RTCAL and TRCAL. RTCAL is used to tell the tag what time interval threshold to use for decoding data-0 verses data-1. TRCAL is used to tell the tag what subcarrier frequency to use when responding to the reader's commands There is also a start-of-command symbol called DELIMITER which is simply a pulse of fixed width approximately 12.5 microseconds long. Because of the passive and semi-passive nature of most Gen2 tags, a "pulse" is defined as a short, deep modulation of the RF carrier. In other words, a Gen2 pulse is a brief absence of the RF carrier.

Note that although the example embodiments described herein are focused on the Gen2 protocol for ultra-high frequency (UHF) in the 900 MHz region, the methods and apparatus described in the following can readily be applied to high frequency (HF) RFID readers in the 13.56 MHz band, or to the 2.45 GHz microwave band, or other RFID readers in the HF, UHF, or microwave bands. The principal commercial application being addressed herein is efficient implementation of amplitude modulated reader-to-tag communications. Amplitude modulation is commonly used in RFID where the tags are very inexpensive and use envelope detection to decode communications from the reader.

Figure 2:
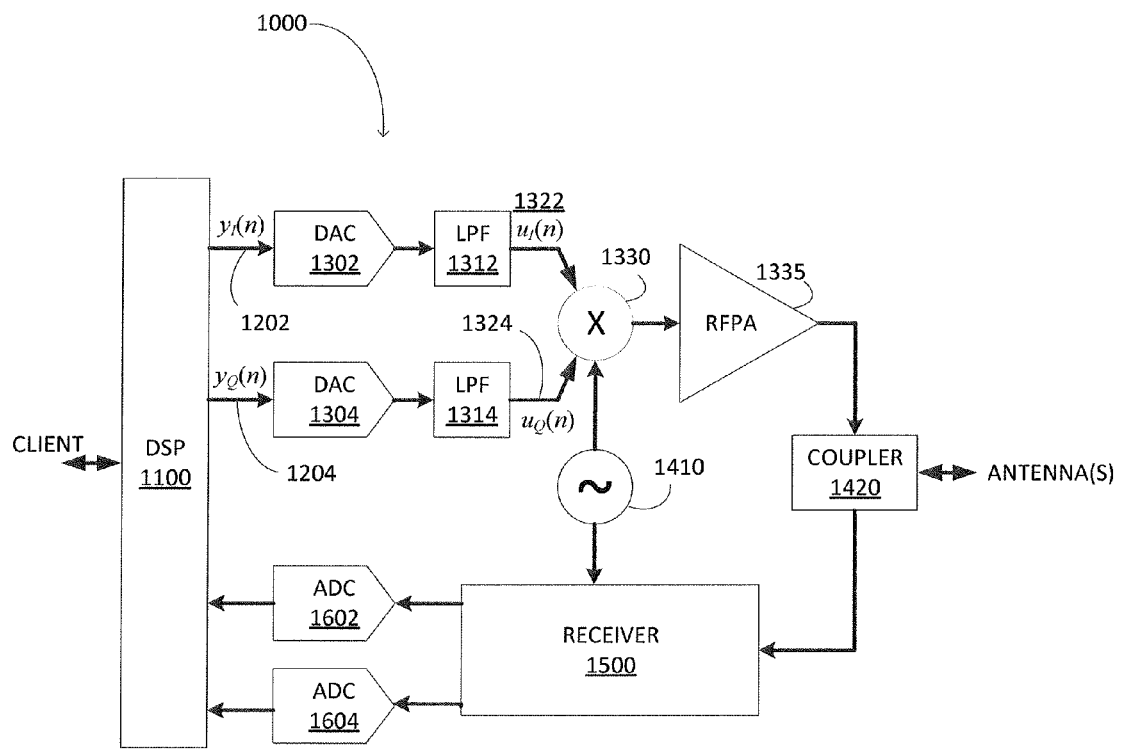
FIG. 2 is a block diagram of an RFID reader using a direct conversion transmitter for generating the amplitude modulated reader-to-tag communications link.

FIG. 2 illustrates an architecture for RFID reader 1000 using a direct conversion transmitter to generate the amplitude modulated RF signal. In this design the in-phase 1202 and quadrature-phase 1204 baseband signals, $y_I(n)$ and $y_Q(n)$, respectively, are produced digitally in software and/or hardware using the digital signal processor (DSP) 1100. The baseband signals 1202 and 1204 are inputs to the digital-to-analog converters 1302 and 1304 respectively, which produce baseband analog output signals. These analog signals pass through low pass filters (LPF) 1312 and 1314 to produce the final baseband modulation signals $u_I(t)$ 1322 and $u_Q(t)$ 1324, respectively. The signals 1322 and 1324 are inputs to quadrature modulator 1330, which also gets local oscillator input $\cos(\omega t)$ from the RF source 1410, which provides the carrier. The quadrature modulator ideally creates the signal $$u_{ideal}(t)=u_I(t)\cos(\omega t)+u_Q(t)\sin(\omega t),$$

and ideally the inputs 1322 and 1324 to the quadrature modulator are perfect continuous time replicas of the digital signals 1202 and 1204, respectively. Note that continuous time signals use time variable t as the argument while sampled time signals use k, m, or n as the argument. The continuous time representation of $y_I(n)$ is denoted $y_I(t)$, and the band limited sampling theory which ties the two together is known to those skilled in the art.

Returning to FIG. 2, ideally $u_I(t)=y_I(t)$, and $u_Q(t)=y_Q(n)$, which would yield an ideal input to the RF power amplifier (RFPA) 1335 of $$y_{ideal}(t)=y_I(t)\cos(\omega t)+y_Q(t)\sin(\omega t).$$

In practice there are imperfections in the baseband analog processing circuitry and in the quadrature modulator which produce gain and phase imbalances such that the actual input to the RFPA 1335 is $$u(t)=\alpha y_I(t)\cos(\omega t)+\beta y_Q(t)\sin(\omega t+\theta).$$

where $\alpha$ represents the actual gain of the in-phase branch, $\beta$ represents the actual gain of the quadrature-phase branch, and $\theta$ represents the phase error in the quadrature modulation between the in-phase and quadrature-phase local oscillator. Ideally $\alpha=\beta=1$ and $\theta=0$, but small imperfections in the analog circuitry are common and must be accounted for in high performance transmitters. This will be addressed further in subsequent paragraphs.

The output signal from quadrature modulator 1330 passes into the RFPA 1335 which produces a high power version applied to the TX-RX coupler 1420. Ideally the RFPA 1335 has a linear transfer function from input to output. However, all power amplifiers exhibit some nonlinearity. The nonlinearity can cause increased spectral occupancy and adjacent channel interference problems. The nonlinearity is often characterized by two functions: amplitude distortion and amplitude-to-phase distortion. Amplitude distortion typically has a more significant effect. Amplitude distortion is the effect wherein the gain of the amplifier depends on the input drive level. This is also sometimes referred to as gain compression and gain expansion (both of which can be exhibited on the same device). Amplitude-to-phase distortion is a secondary problem, which also must be mitigated for high performance systems. Amplitude-to-phase distortion is the phenomenon wherein the phase shift through the RFPA varies depending on the input drive level. A common technique to mitigate the problem of amplitude and phase distortion is digital predistortion in the DSP 1100. This will be discussed further in subsequent paragraphs.

Continuing with FIG. 2, the coupler 1420 sends substantially most or all of the high power transmit signal to the antennas, while any signal coming into the reader from the antennas is mostly or all passed into the receiver 1500. The receiver typically produces in-phase and quadrature-phase baseband receiver outputs which are inputs to analog-to-digital converters (ADCs) 1602 and 1604. The digitized baseband receiver output is passed into the DSP 1100 for processing and decoding. The DSP 1100 interfaces with a client device to report tag responses.

Figure 3:
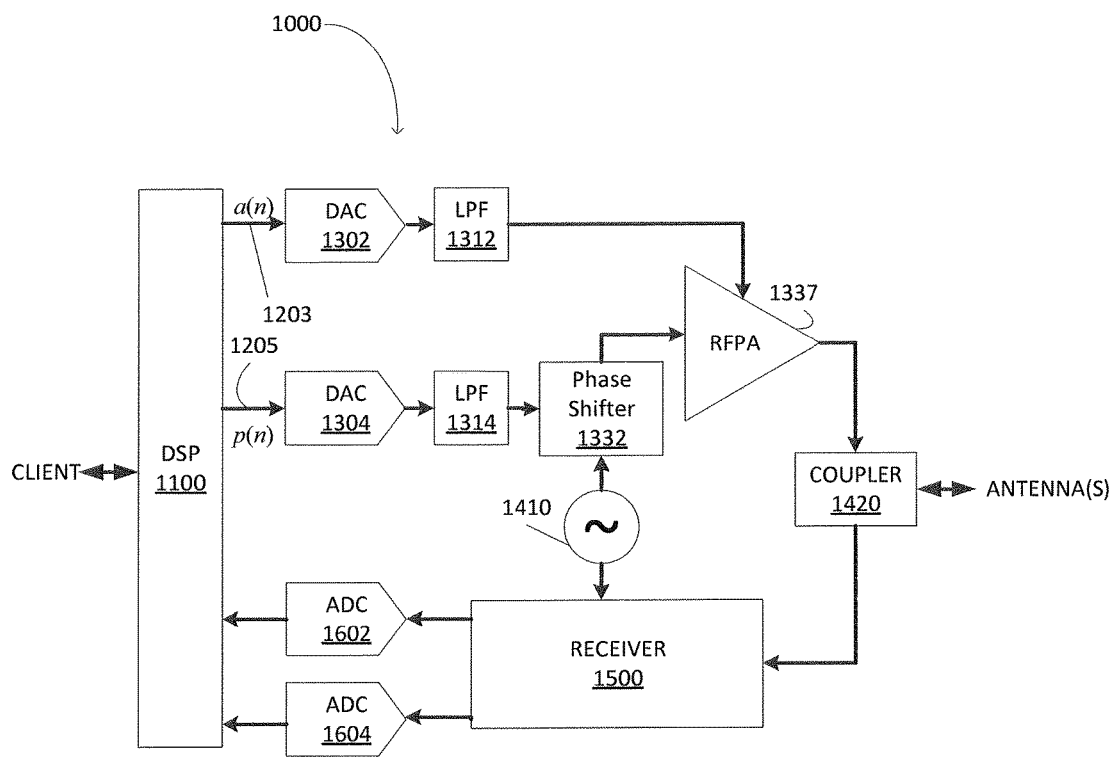
FIG. 3 is a block diagram of an RFID reader using a polar modulation transmitter for generating an amplitude modulated reader-to-tag communications link.

FIG. 3 illustrates another possible architecture for RFID reader 1000 based on polar modulation. In this case DSP 1100 produces an amplitude signal a(n) 1203 and a phase signal p(n) 1205 which pass through the DACs 1302 and 1304 and LPFs 1312 and 1314. The phase signal p(n) controls the phase shifter 1332, which modulates the phase of the RF source 1410 at the input to the RFPA 1337. Unlike the direct conversion transmitter in FIG. 2, which represents the transmit signal as a Cartesian baseband signal $y_I(t)+jy_Q(t)$, the polar modulation transmitter illustrated in FIG. 3 represents the transmit signal in polar coordinates $a(t)\,e^{jp(t)}$. One advantage of this approach is that no quadrature mixer is required. In addition to saving the circuitry, no I/Q imbalance problems are present. Another advantage is that the amplitude modulation is normally accomplished by bias or power supply modulation on the RFPA 1337, which can lead to much higher power efficiencies. However, the polar implementation requires tight control of the time synchronization between the a(t) and p(t) signals, which can be challenging. Nonlinear amplitude and phase distortion is also a problem on polar modulation type transmit systems. Baseband digital predistortion to mitigate amplitude and phase distortion can also be implemented for polar modulation.

Figure 4:
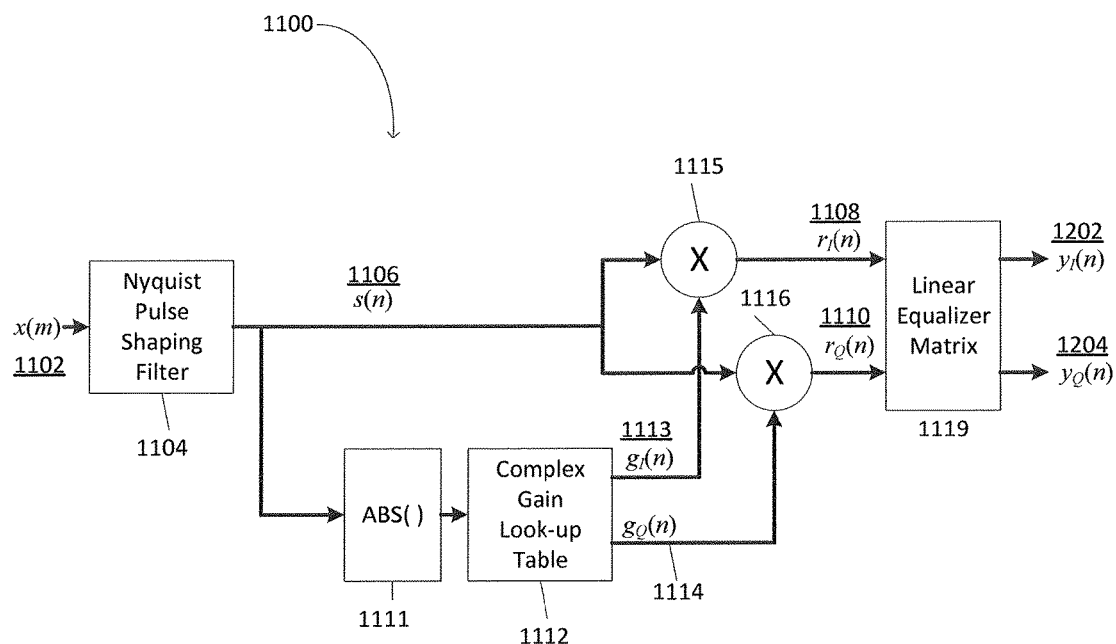
FIG. 4 is a block diagram of an RFID reader transmit signal generation section.

FIG. 4 illustrates an implementation of digital baseband transmitter synthesis for RFID reader 1000 on DSP 1100. The transmit signal is represented by a pulse code modulated (PCM) signal x(m) 1102 which is a uniformly sampled data representation of the pulse interval encoded transmitter waveform. The PCM signal 1102 is passed through a Nyquist pulse shaping filter 1104 and possibly some additional interpolation filters (not shown) to increase the sampling rate. Note the sampling index for 1102 is m as opposed to n for the output signal 1106. This is to denote a change in sampling rate imparted by the Nyquist filter 1104. Higher output sampling rates often reduce the complexity of the LPF blocks 1312 and 1314 in analog hardware. Blocks 1111 through 1116 represent a traditional nonlinear digital predistorter for direct conversion transmitters to mitigate the nonlinear amplitude and phase distortion present in the RFPA 1335. The absolute value function 1111 determines the magnitude, or equivalently the amplitude, of the baseband signal. Block 1111 translates the amplitude level into an index used to look up a complex gain in the look up table, block 1112. The complex gain look-up table 1112 represents the inverse complex gain of the RFPA 1335. Since the look up table is complex it can adjust both the amplitude and phase of the baseband signal, depending on the instantaneous amplitude, or drive level, of the output signal 1106 of the pulse shaping filter 1104. The "real" (in-phase) multiplier 1115 and "imaginary" (quadrature-phase) multiplier 1116 weight the Nyquist filter output to produce the complex baseband signal 1108 and 1110 needed to produce an accurate output from the RFPA 1335. However, the linear distortion from the baseband and mixer circuitry must be mitigated as well. If the amplitude imbalance and phase offset are not accounted for and corrected, the digital predistortion will not work as desired. Therefore, a linear equalization matrix 1119 is used to compensate for the in-phase/quadrature-phase amplitude and phase imbalance. It is worth noting that direct conversion transmitters also suffer from DC offset impairments in the baseband and mixer circuitry, but this impairment is often trimmed out using auxiliary DAC circuitry and therefore does not directly bear on the computational complexity of the digital transmitter synthesis shown in FIG. 4.

FIG. 4 represents significant computational complexity, and therefore cost. The PCM signal 1102 can be sampled at up to 320 KHz into the Nyquist filter 1104. After pulse shaping and interpolation the sampling rate will generally be somewhere between 10 MHz and 100 MHz. The nonlinear digital predistortion performed by processing blocks 1111, 1112, 1115 and 1116 will be processed at this rate, as will the linear equalization multiplication 1119. The overall computational complexity of this transmitter synthesis system can be hundreds of millions of multiplications and additions per second. The Nyquist and interpolation filtering in block 1104 also imparts significant group delay on the transmit signal, which can be a problem in meeting the timing requirements of the Gen2 protocol.

In addition to the computational complexity and group delay, another problem with the technique shown in FIG. 4 is the nature of the Nyquist filtering 1104. Nyquist filtering, which is often in the form of a raised cosine filter, is commonly used in digital transmission systems. The filter is designed to produce no inter-symbol interference (ISI) at the uniformly spaced sampling instants given by the sampling times of the PCM signal x(m) 1102. However, the behavior of the Nyquist filter output signal 1106 between the sample instants is not precisely controlled and depends on the neighboring signal samples in x(m). In most other digital communications systems such as cellular phones, satellite TV, or Wi-Fi, the signal trajectory between PCM samples would be relatively unimportant as long as there is no ISI at the sample instants. However, in some RFID systems such as those using the Gen2 protocol, the behavior of the signal s(n) 1106 between symbol sample instants is very important. The Gen2 protocol imposes maximum rise and fall times, overshoot, and ripple requirements on the waveform. Data decoding in the PIE line code is governed by the rising edge-to-rising edge timing of the waveform. However, using Nyquist filters causes the edge timing to vary depending on the data sequence. While conventional Nyquist filters give good performance in the frequency domain in terms of spectral occupancy, the lack of control on the time domain waveform is a major drawback.

Figure 5:
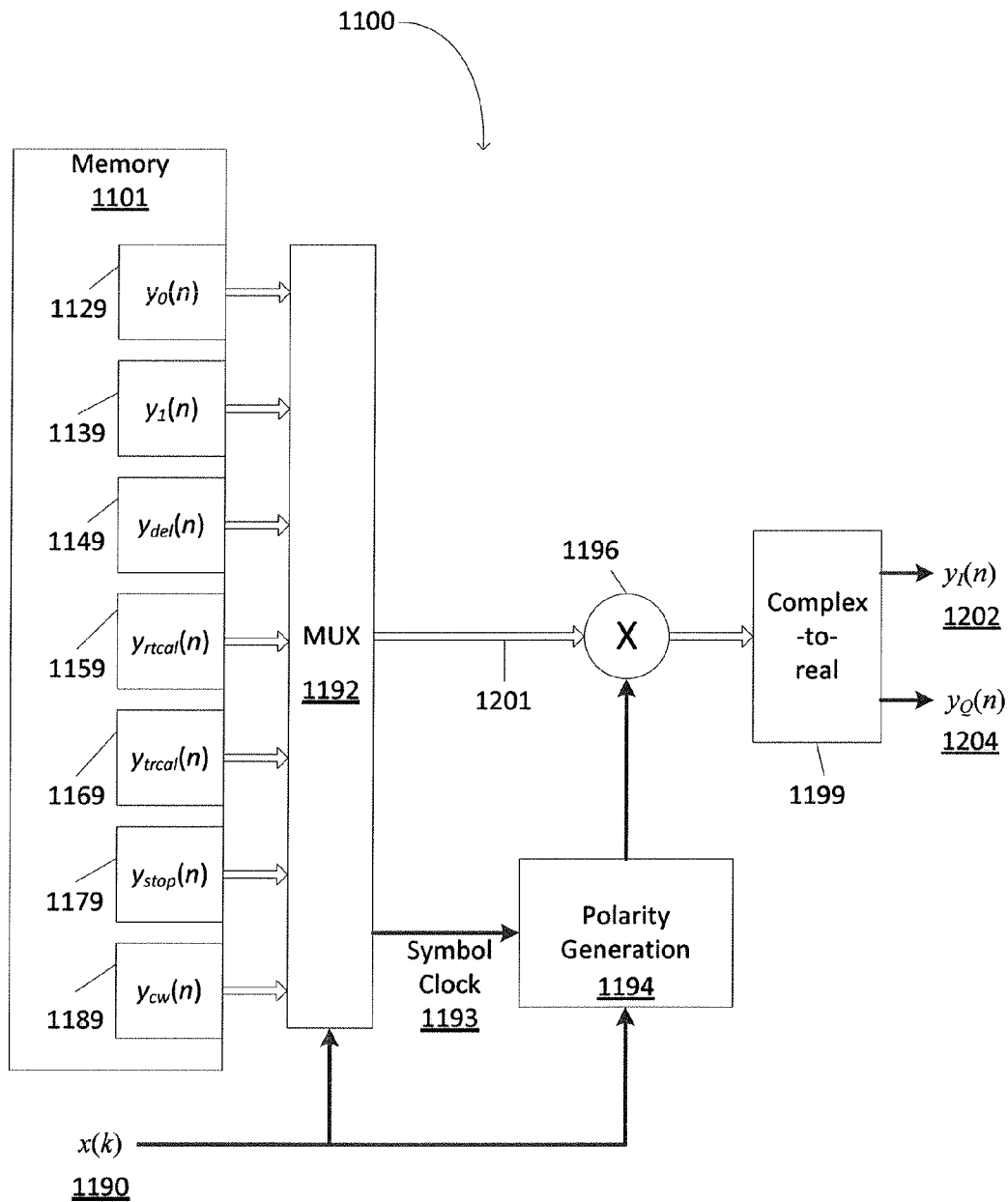
FIG. 5 is a block diagram of the RFID reader transmit synthesis technique for use with direct conversion transmitters.

FIG. 5 illustrates one embodiment of the improved transmitter synthesis technique disclosed herein. Transmitter symbols are represented by waveforms pre-computed in table format. The non-transitory signal tables are stored in memory 1101. The memory could be internal memory integrated into the DSP, FPGA, or ASIC device, or it could be external memory attached to the processor via a memory bus. The signals are data-0 waveform $y_0(n)$ 1129,
data-1 waveform $y_1(n)$ 1139,
delimiter waveform $y_{del}(n)$ 1149,
RTCAL waveform $y_{rtcal}(n)$ 1159,
TRCAL waveform $y_{trcal}(n)$ 1169,
"stop" waveform $y_{stop}(n)$ 1179, and
"CW" waveform $y_{cw}(n)$ 1189.

This collection of waveforms is fully compensated for nonlinear and linear predistortion. Instead of PCM encoding the transmitter waveform as shown in FIG. 4, this example implementation encodes a waveform using a discrete alphabet of symbols drawn from a list such as the list above. The alphabet symbol sequence x(k) 1190 selects which waveform is outputted. The symbol index k does not represent uniform sampling in this case, since the symbols are different durations depending on the data pattern.

The polarity generator 1194 handles +1/−1 polarity inversions as required by the PR-ASK protocol in the Gen2 specification. If using DSB-ASK mode from the Gen2 specification or Manchester encoder commonly used in other RFID protocols, then the polarity inversion function 1194 produces all +1 sequences with no phase inversions. In either case, the polarity can be said to be selectively applied as required for each symbol. The description of this embodiment will primarily focus on PR-ASK modulation from the Gen2 specification, since it may be the highest performing modulation format in terms of spectral efficiency. The technique can then be readily applied to Gen2 DSB-ASK by those skilled in the art, to Manchester encoding which is another reader-to-tag modulation format used in RFID, or to any other RF format or technique.

Figure 19:
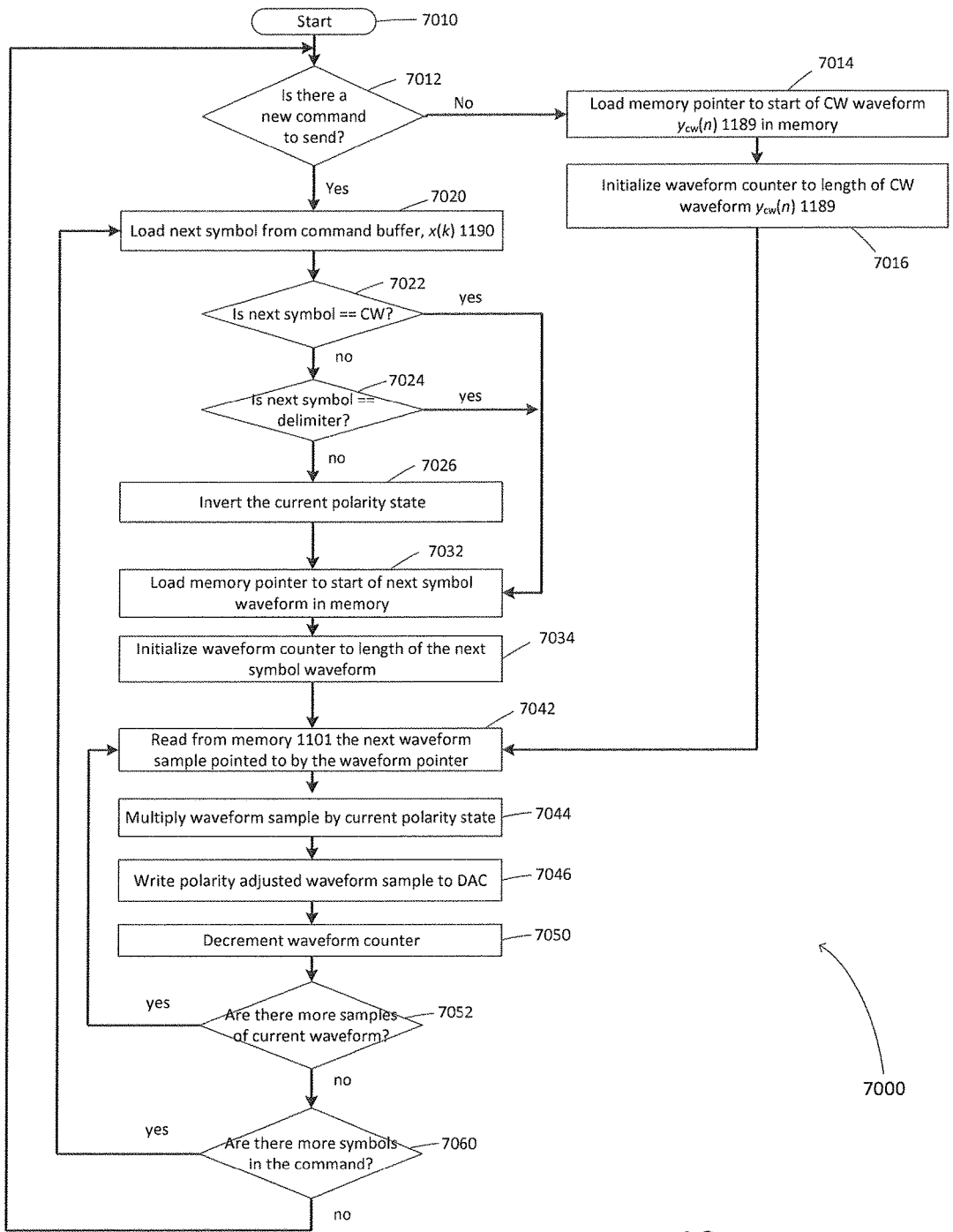
FIG. 19 is a flowchart illustrating the operation of an RFID system transmitter according to example embodiments of the invention.

For notational clarity FIG. 5 represents complex signals with a wide arrow like arrow 1201. Demultiplexer block 1199 demultiplexes the real and imaginary parts of the complex signal to the in-phase and quadrature-phase components, which are output to the baseband analog circuitry. The only multiplication required in this example is the polarity multiplier 1196, which multiplies the signal by +1 or −1 so that the required polarity is imparted to each waveform. This is a low complexity operation. The MUX 1192, polarity generator 1194, and polarity multiplier 1196 can be implemented in software running on a microprocessor or DSP connected to the memory 1101 or it could be implemented in gate level logic on a FPGA or ASIC. FIG. 19 will show a detailed implementation.

The computational advantage comes for the fact that for memoryless linear predistortion and nonlinear predistortion, which is what the processing in FIG. 4 is designed to handle, the polarity inversion 1196 preserves the predistortion. The nonlinear predistortion in FIG. 4 can be expressed as $$r(n)=r_I(n)+j\cdot r_Q(n)=s(n)\cdot G(|s(n)|)\cdot e^{j\phi(|s(n)|)}$$

where $G(|s(n)|)$ and $\phi(|s(n)|)$ are the amplitude dependent gain and phase, respectively, of the complex nonlinear predistortion gain which is stored in look up table 1112. From this expression, one can see that $$-r(n)=-s(n)\cdot G(|s(n)|)\cdot e^{j\phi(|s(n)|)}.$$

Likewise, the linear predistortion in block 1119 of FIG. 4 can be expressed mathematically as $$\begin{bmatrix} y_I(n) \\ y_Q(n) \end{bmatrix} = \begin{bmatrix} M_{11} & M_{12} \\ M_{21} & M_{22} \end{bmatrix} \cdot \begin{bmatrix} r_I(n) \\ r_Q(n) \end{bmatrix}$$

from which one can see that $-y(n)=-M\cdot r(n)$, where a shorthand vector/matrix notation is implied. Therefore, if an ideal transmit waveform s(n) 1106 is transformed by nonlinear and linear predistortion as in FIG. 4 to produce a complex valued waveform y(n), then its negative waveform −s(n) must transform into −y(n) by the nonlinear and linear predistortion. This means that the stored waveforms in FIG. 5 may be stored as their predistorted versions and no additional run time computation is required. The −1 polarity inversion in 1196 preserves predistortion.

The polarity generation block 1194 is needed for Gen2 PR-ASK generation. This block can be a state machine with a single bit state which represents either positive (+1) or negative (−1) polarity. The MUX logic 1192 selects and outputs the variable length waveforms depending on the input's code sequence x(k) 1190. Each time the MUX block 1192 in FIG. 5 finishes clocking out the previously selected waveform the next code in the sequence x(k) 1190 is clocked in, which will select the next waveform for the MUX 1192 to clock out. The MUX 1192 knows how many samples are included in each of the waveforms are so that the correct number of samples is clocked out. The MUX also provides a symbol clock 1193 to the polarity generator 1194 when the previous waveform is finished clocking out. The polarity generator 1194 updates its +1/−1 output depending on its current state and on the next symbol in the sequence. If the new output symbol is a delimiter or CW, the polarity state stays the same, otherwise the polarity inverts. This will be illustrated by example after the optimum waveform generation technique is described.

The embodiment shown in FIG. 5 can be easily modified by those skilled in the art for cases when a quadrature modulator such as 1330 in FIG. 2 is replaced with a single baseband input modulator. The amplitude-to-phase distortion of the RFPA 1335 cannot be predistorted with a single baseband channel, but the resulting embodiment is less expensive. Likewise, some embodiments may not use linear and/or nonlinear predistortion at all. These variations are still within the spirit and scope of the invention exemplified in this specification.

Figure 6:
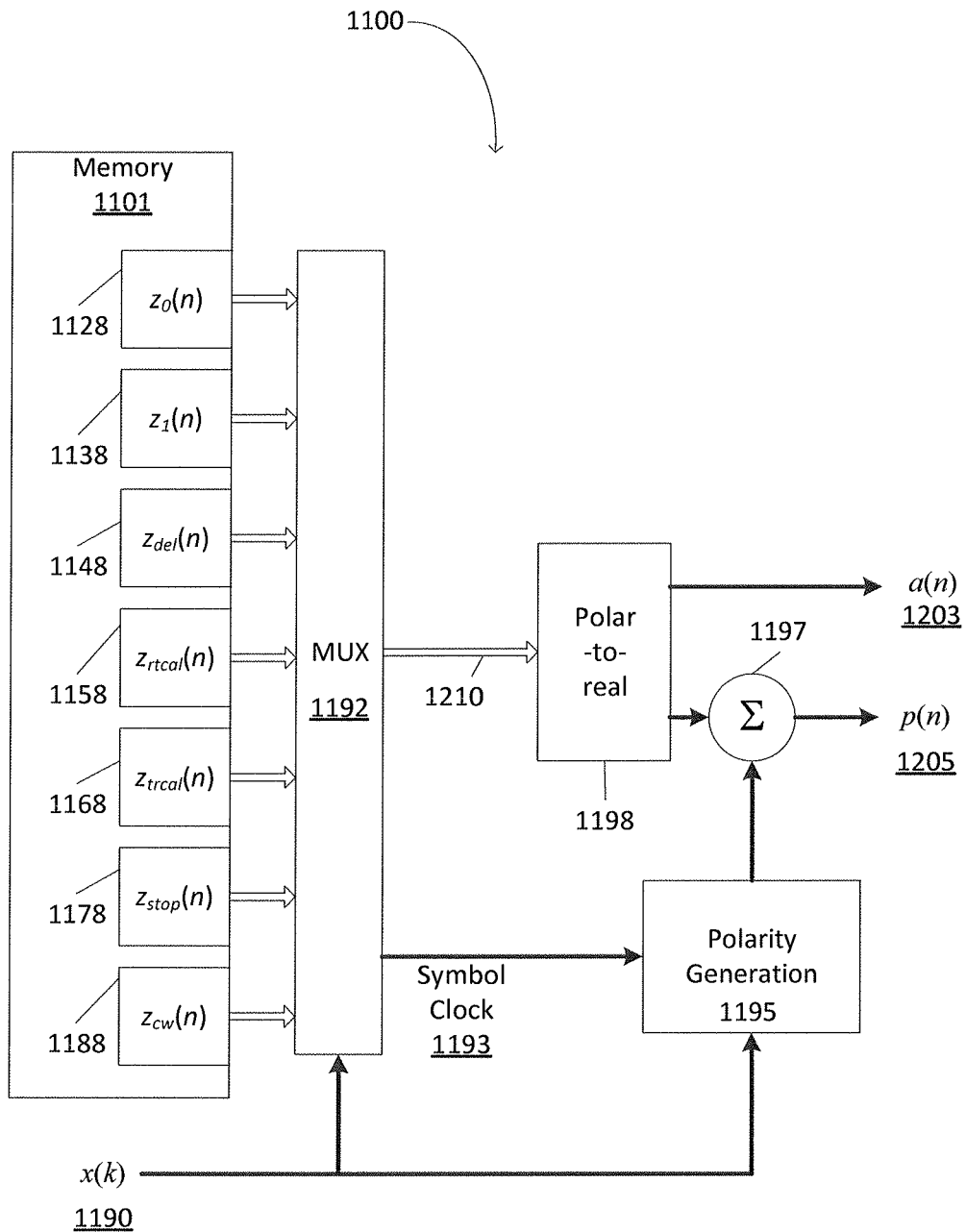
FIG. 6 is a block diagram of the RFID reader transmit synthesis technique for use with polar modulation transmitters.

FIG. 6 illustrates an embodiment of the improved transmitter synthesis technique for use with polar modulation transmitters as shown in FIG. 3. Transmitter symbols are represented by pre-computed waveforms stored in memory 1101 in table format as amplitude and phase. The polar coordinate signals are data-0 waveform $z_0(n)$ 1128,
data-1 waveform $z_1(n)$ 1138,
delimiter waveform $z_{del}(n)$ 1148,
RTCAL waveform $z_{rtcal}(n)$ 1158,
TRCAL waveform $z_{trcal}(n)$ 1168,
"stop" waveform $z_{stop}(n)$ 1178, and
"CW" waveform $z_{cw}(n)$ 1188.

This collection of waveforms is fully compensated for nonlinear and linear predistortion.

The polarity generator 1195 handles polarity inversions as required by the PR-ASK protocol in the Gen2 specification by adding 0 degrees to the phase signal p(n) 1205 for non-inverted waveforms and by adding 180 degrees to the phase signal p(n) 1205 for inverted waveforms. The amplitude signal a(n) 1203 is not affected by the polarity generator 1195 in polar modulation transmitters. If using DSB-ASK mode from the Gen2 specification or Manchester encoder commonly used in other RFID protocols, then the polarity inversion function 1195 produces all 0 degree phase addition sequences with no phase inversions. In either case, the polarity can be said to be selectively applied as required for each symbol. The description of this embodiment will primarily focus on PR-ASK modulation from the Gen2 specification, since it may be the highest performing modulation format in terms of spectral efficiency. The technique can then be readily applied to Gen2 DSB-ASK by those skilled in the art, to Manchester encoding which is another reader-to-tag modulation format used in RFID, or to any other RF format or technique.

For notational clarity FIG. 6 represents polar signals with a wide arrow like arrow 1210. Demultiplexer block 1198 demultiplexes the polar signal to the separate real valued amplitude and phase components which are output to the baseband analog circuitry. The adder 1197 adds the 0 degree or 180 degree output of the polarity generator 1195 so that the required polarity is imparted to each waveform. This is a low complexity operation. The MUX 1192, polarity generator 1195, and polarity adder 1197 can be implemented in software running on a microprocessor or DSP connected to the memory 1101 or it could be implemented in gate level logic on a FPGA or ASIC.

The computational advantage comes for the fact that for memoryless nonlinear predistortion, the polarity inversion can be expressed in polar form as $$-r(n) = -s(n) \cdot G(|s(n)|) \cdot e^{j\phi(|s(n)|)}$$
$$= s(n) \cdot e^{j\pi} \cdot G(|s(n)|) \cdot e^{j\phi(|s(n)|)}$$
$$= s(n) \cdot G(|s(n)|) \cdot e^{j(\phi(|s(n)|)+\pi)}.$$

where $G(|s(n)|)$ and $\phi(|s(n)|)$ are the amplitude dependent gain and phase, respectively, of the complex nonlinear predistortion gain which is stored in look up table 1112. Therefore, if an ideal transmit waveform s(n) 1106 is transformed by nonlinear predistortion to produce a polar valued waveform z(n), then its negative waveform −s(n) must transform into $z(n)e^{j\pi}$ by the nonlinear predistortion. This means that the stored waveforms in FIG. 6 may be stored as their predistorted versions and no additional run time computation is required except adding 180 degrees to the inverted waveform phase signals.

The polarity generation block 1195 is needed for Gen2 PR-ASK generation. This block can be a state machine with a single bit state which represents either positive (0 degrees) or negative (180 degree) polarity. The MUX logic 1192 selects and outputs the variable length waveforms depending on the input's code sequence x(k) 1190. Each time the MUX block 1192 in FIG. 6 finishes clocking out the previously selected waveform the next code in the sequence x(k) 1190 is clocked in, which will select the next waveform for the MUX 1192 to clock out. The MUX 1192 knows how many samples are included in each of the waveforms are so that the correct number of samples is clocked out. The MUX also provides a symbol clock 1193 to the polarity generator 1195 when the previous waveform is finished clocking out. The polarity generator 1195 updates its 0 degree/180 degree output depending on its current state and on the next symbol in the sequence. If the new output symbol is a delimiter or CW, the polarity state stays the same, otherwise the polarity inverts.

Note that methods to derive the complex gain for nonlinear predistortion and the equalization matrix M for linear predistortion are known to those skilled in the art. This disclosure describes embodiments of a system and method for implementing the predistortion with very low computational resources. If one can derive suitable fixed waveform symbols $s_0(n)$, $s_1(n)$, $s_{del}(n)$, $s_{RTCAL}(n)$, $s_{TRCAL}(n)$, and $s_{stop}(n)$, for data-0, data-1, delimiter, RTCAL, TRCAL, and stop symbols, respectively, then the system can perform a one-time application of nonlinear and linear predistortion to these waveforms to get $y_0(n)$, $y_1(n)$, $y_{del}(n)$, $y_{RTCAL}(n)$, $y_{TRCAL}(n)$, $y_{stop}(n)$, and $y_{cw}(n)$. This represents a very large reduction in real time signal processing hardware and software. Using fixed waveforms as shown in FIG. 5 also solves the problem with time domain waveform constraints, which is difficult to do using Nyquist filters. The next few paragraphs describe the optimum waveforms used as the basis for the communications link in Gen2 PR-ASK.

Figure 7:
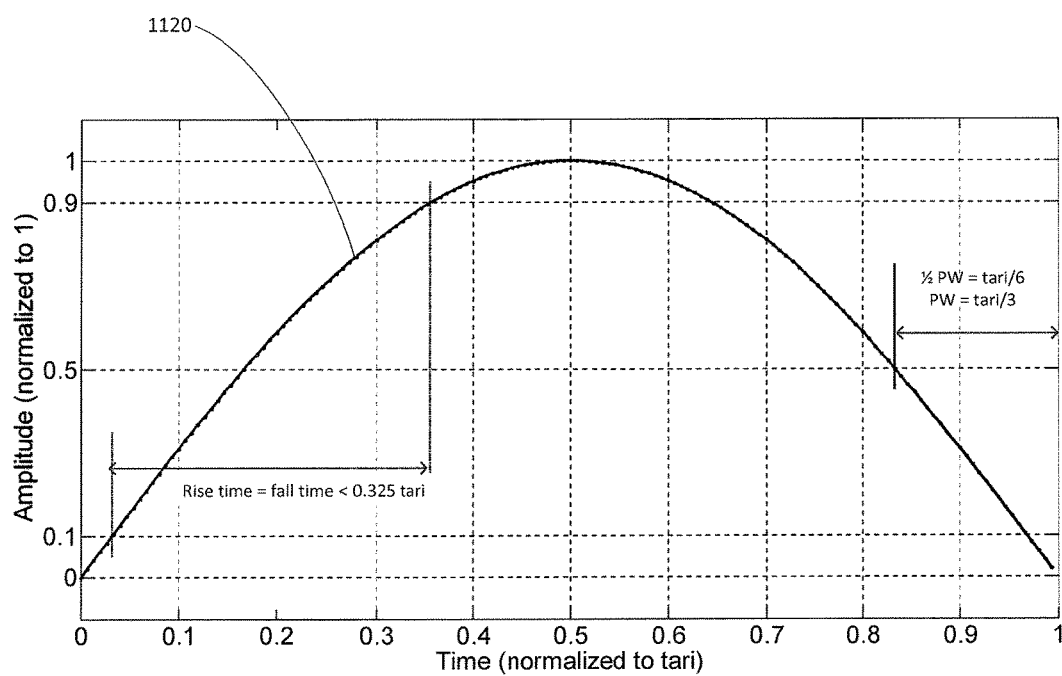
FIG. 7 is a plot of the proposed data-0 waveform for Gen2 PR-ASK according to example embodiments of the invention.

FIG. 7 shows the $s_0(t)$ waveform 1120 for a data-0 symbol using Gen2 PR-ASK. The signal can be expressed mathematically as $$s_0(t) = \sin(\pi t/\tau), \text{ for } 0 \leq t \leq \tau,$$

where τ is defined as the type-A reference interval, or tari, for the Gen2 protocol specification. There are many good qualities to this waveform. The rise and fall time is approximately 32.5% of τ, which meets the maximum rise and fall time specification. A sequence of the $s_0(t)$ waveforms 1120 results in a substantially perfect sinusoid with period 2τ, since for PR-ASK the polarity generator 1194 will invert the phase of the signal on every bit period. The polarity reversing sequence of $s_0(t)$ 1120 signals produces a sine wave. This sine wave has substantially the lowest possible spectral occupancy for this all data-0 sequence since there are no harmonics. The "pulse width" PW=τ/3 is shown in FIG. 7 which meets the Gen2 specification. Note that one could define $s_0(t)$ differently such as by using splines, Fourier techniques, or other means, which substantially result in the same waveform. Such approaches, which avoid the sin( ) formula but result in essentially the same waveforms are within the spirit and scope of this disclosure.

Figure 8:
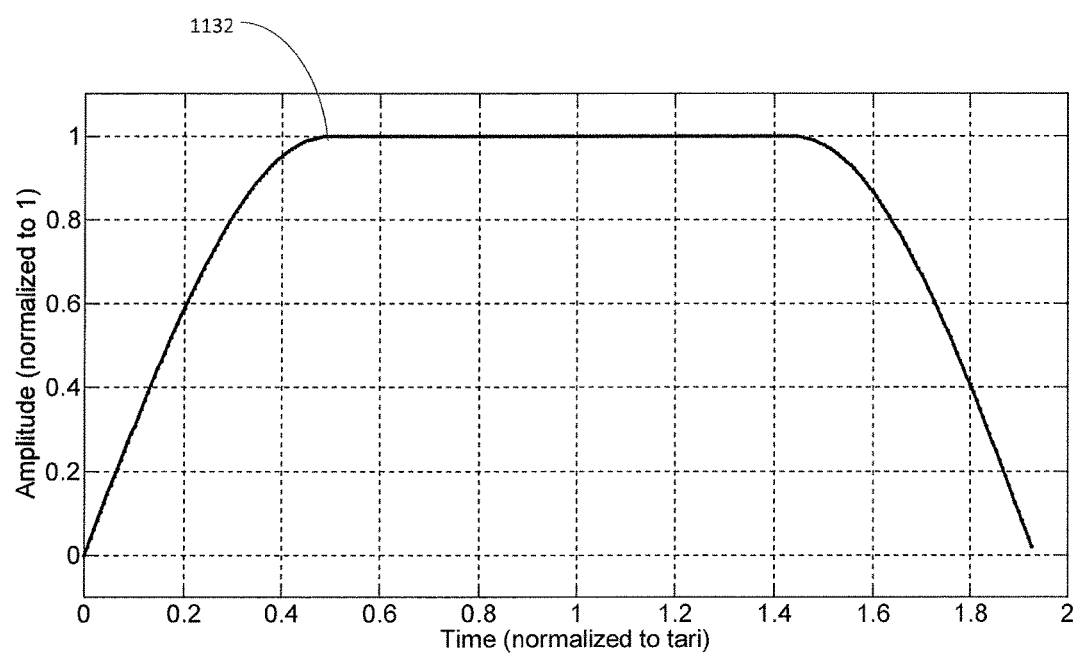
FIG. 8 is a plot of the prototype data-1 waveform, which is the starting point for data-1 waveform optimization with example embodiments of the invention.

The remaining symbol waveforms for Gen2 are more involved to generate. FIG. 8 shows the starting point for the data-1 waveform, which will be referred to herein as the $p_1(t)$ prototype waveform 1132. The Gen2 specification allows the data-1 length to be $$1.5\tau \le \text{data-1 length} \le 2\tau.$$

Although the methods disclosed herein can be used for any length, the prototype waveform 1132 has length of about 1.933τ, which has advantages as described later. The signal is defined as $$p_1(t) = \begin{cases} \sin(\pi t/\tau), & 0 \le t < \tau/2 \\ 1, & \tau/2 \le t < 1.433\tau \\ \sin(\tau(t-0.933\tau)/\tau), & 1.433\tau \le t < 1.933\tau \end{cases}$$

The signal $p_1(t)$ is continuous and continuously differentiable when appended with either phase inverted $s_0(t)$ or phase inverted $p_1(t)$. Since the rising and falling edges of $p_1(t)$ are made up of sinusoidal segments of the same amplitude and period as $s_0(t)$, the combined signal will be infinitely differentiable at and near the boundary points where the signals meet. From a spectral occupancy standpoint, the main problem with this waveform are the points of $p_1(t)$ where sinusoidal segments meet the constant "1" segment. At these points the second and higher derivatives are discontinuous, which leads to significant high frequency content. An optimization technique can be used to reduce the spectral occupancy of the waveform. Many optimization procedures are applicable such as downhill simplex, simulated annealing, etc. Here the method of quadratic programming is described using quarter wave periodic construction.

The waveform must be stored in DSP memory 1101 in some sampled format. The sampled format lends itself better to optimization techniques than continuous time representations. Therefore, consider the sampled data representation using sampling rate $F_s=19.2$ MHz, which is a popular sampling rate using readily available crystal oscillators and which produces 240 samples per 12.5 microsecond tari period. The 1.933 tari $p_1(t)$ waveform corresponds to a 464 sample waveform $p_1(n)$. This is just an example and is by no means restrictive. Other sampling rates can be used to give integer waveform lengths for 12.5 microsecond tari, such as 14.4 MHz or 24 MHz. Other values of tari are also possible.

Figure 9:
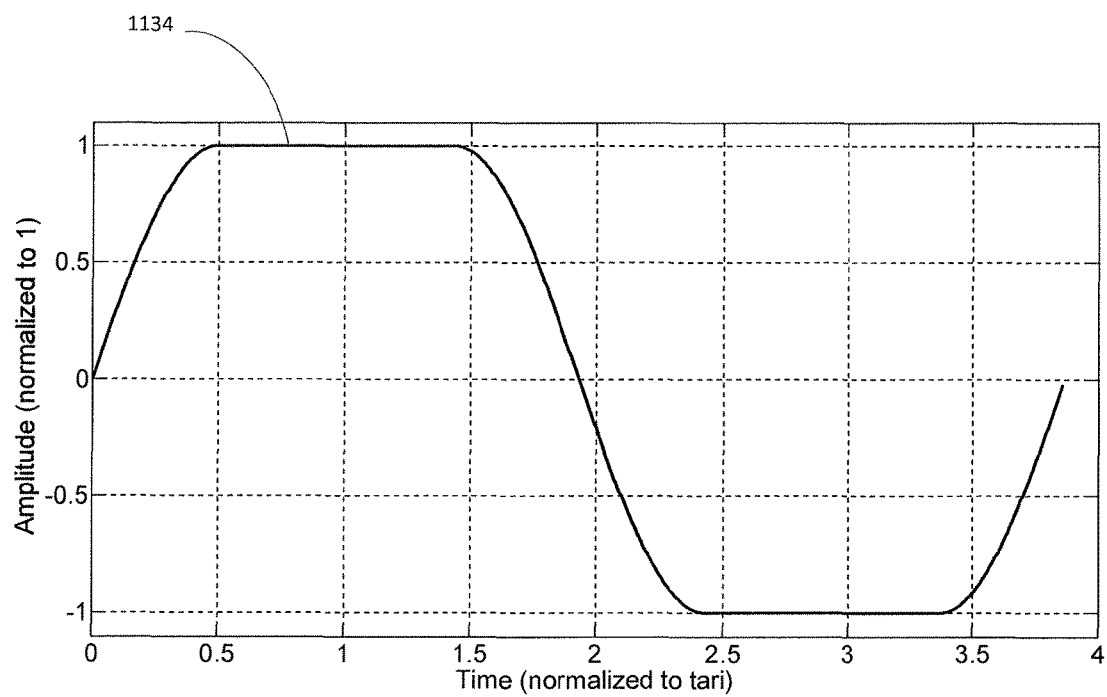
FIG. 9 is a plot of the prototype data-1 waveform extended to create a zero mean periodic waveform with quarter wave symmetry.
Figure 11A:
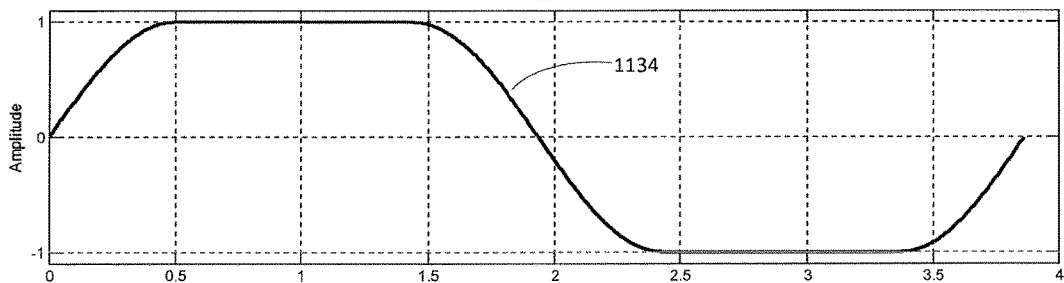
FIG. 11 is a plot of the data-1 waveform result of quadratic programming optimization using the discrete Fourier transform to compute harmonic energy which is to be minimized with some embodiments of the invention.
Figure 11B:
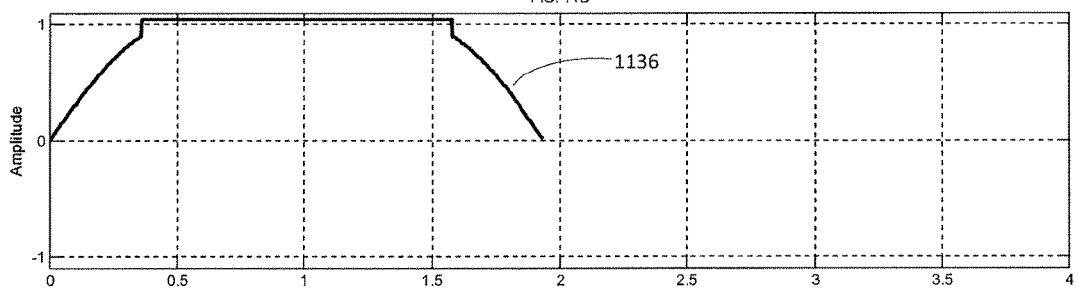
Figure 11C:
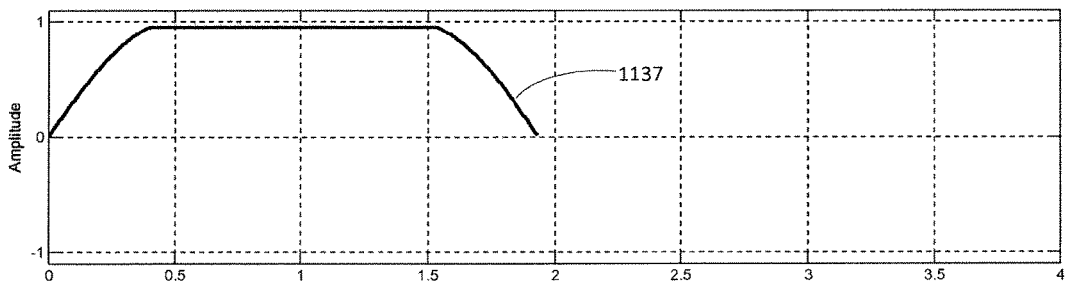
Figure 11D:
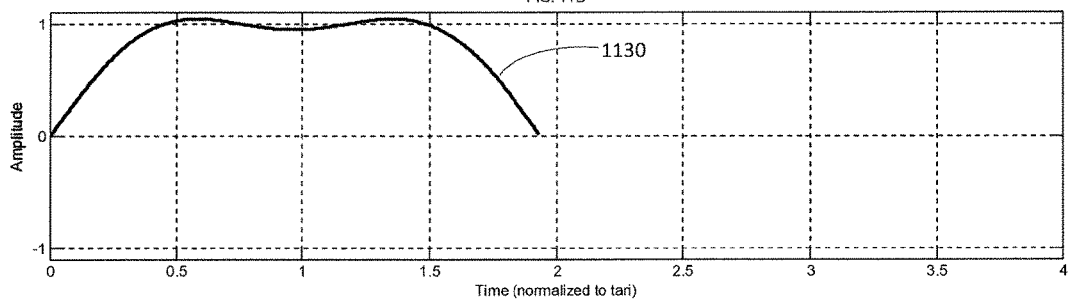

Next consider a periodic signal with period 3.866 tari obtained by inverting and extending $p_1(n)$ as shown in FIG. 9 to get waveform 1134

$$h_1(n) = \begin{cases} p_1(n), & 0 \le n < 464 \\ -p_1(n-464), & 464 \le n < 928 \end{cases}$$

The discrete Fourier transform (DFT) of $h_1(n)$ 1134 is $$H_1(k) = \sum_{n=0}^{N-1} h_1(n) e^{-j2\pi nk/N}$$

where N=928.

The quarter wave symmetry quadratic programming method described over the next few paragraphs will be used for all of the waveforms except for CW. The full period waveforms will be referred to as $h_1(n)$ 1134, $h_{del}(n)$ 1144, $h_{RTCAL}(n)$ 1154, $h_{TRCAL}(n)$ 1164, and $h_{stop}(n)$ 1174. For $h_{del}(n)$ 1144 and $h_{stop}(n)$ 1174 the optimized result $s_{del}(n)$ 1140 and $s_{stop}(n)$ 1170 are quarter waves from the full period, while $s_1(n)$ 1130, $s_{RTCAL}(n)$ 1150, and $s_{TRCAL}(n)$ 1160 are half waves from the full period. In all illustrated cases the periodic waveforms have quarter wave symmetry so the quadratic programming form is derived for this. Thus, over the next few paragraphs the "1" subscript is dropped and the quarter wave symmetry quadratic programming algorithm is described generically in terms of a periodic waveform h(n) with period N.

The generic DFT equation is $$H(k) = \sum_{n=0}^{N-1} h(n) e^{-j2\pi nk/N}$$

with length N. The expression for the discrete Fourier transform can be written in matrix-vector form as $$H = W \cdot h$$

where $$H = \begin{bmatrix} H(0) \\ H(1) \\ \vdots \\ H(N-1) \end{bmatrix}$$

$$h = \begin{bmatrix} h(0) \\ h(1) \\ \vdots \\ h(N-1) \end{bmatrix}$$

$$W = [W_{n,k}] = [e^{-j2\pi nk/N}]$$

The waveform h(n) has half wave symmetry, so we can reduce the DFT computation by using only the first half of h(n)

$$H = W_{hw} \cdot h_{hw}$$

where, using a Matlab type notation with 0-based indexing for compactness, $$W_{hw} = W(:,0:N/2-1) - W(:,N/2:N-1),$$

$$h_{hw} = h(0:N/2-1).$$

This is an N×N/2 DFT matrix, producing all of the DFT harmonic components using half the computation and only the first half period of h(n) as input.

The waveform h(n) has quarter wave symmetry, so we can reduce the DFT computation by using only the first quarter of h(n)

$$H = W_{qw} \cdot h_{qw}$$

where, using a Matlab type notation with 0-based indexing for compactness, $$W_{qw} = W_{hw}(:,0:N/4-1) + W_{hw}(:,N/2-1:-1:N/4),$$

$$h_{qw} = h(0:N/4-1).$$

This is an N×N/4 DFT matrix, producing all of the DFT harmonic components using one quarter the computation from the first quarter period of h(n) as input.

Because the signal h(n) has zero mean and half wave symmetry its DFT will only have non-zero odd harmonics. All even terms are identically zero. We can improve efficiency by eliminating the even harmonic terms, and only compute the DFT over positive frequencies since the signal is real valued, $$H_{odd} = W_{odd} \cdot h_{qw}$$

where, using a Matlab type notation with 0-based indexing for compactness, $$W_{odd} = W_{qw}(1:2:N/2-1,:).$$

where $W_{odd}$ is an N/4×N/4 DFT matrix which computes the positive odd harmonics in H using the quarter wave input. Next define a weighting vector for the harmonic terms in the frequency vector $H_{odd}$, $$c = \begin{bmatrix} c(0) \\ c(1) \\ \vdots \\ c(N/4-1) \end{bmatrix}.$$

In this embodiment the weight vector is $$c(k) = 0.1 + 0.9 \cdot \tan h(2 \cdot k \cdot F_p/1.5e6),$$

where $F_p = F_s/N$ is the fundamental frequency of the periodic waveform h(n). This provides a smooth weight function that weighs higher harmonics more than lower harmonics. For the waveform optimization we wish to minimize only the harmonic components above some frequency, which is an optimization parameter. In this example embodiment for 12.5 microsecond tari we use 100 KHz, so we would set c(k)=0 for all k for which $k \cdot F_p \leq 100$ KHz.

For notational clarity we will denote the $h_{qw}$ vector to be optimized as v. Then the final quarter wave quadratic programming optimization can be expressed as $$v_{opt} = \min_v (v^T \cdot G \cdot v), \text{ subject to } v_{lb} \leq v \leq v_{ub},$$

where $$G = (\text{diag}(c) \cdot H_{odd})^T \cdot (\text{diag}(c) \cdot H_{odd}).$$

The superscript T represents vector or matrix transpose, the diag(c) function represents a diagonal matrix with the c weight vector along the diagonal, $v_{lb}$ and $v_{ub}$ are lower and upper bounds, respectively, which control ripple, and $v_{opt}$ is the solution which minimizes the argument in parenthesis across all possible values of v subject to the lower and upper bound constraints. The quadratic programming optimization algorithm is known to those skilled in the art Returning now to the specific case of finding the optimum $s_1(n)$ 1130, in this example embodiment using 19.2 MHz sampling frequency and N=928 period, the fundamental period frequency is $F_p$=19.2 MHz/928=20.69 KHz, which means the $5^{th}$ harmonic is 103.45 KHz. We therefore wish to minimize the $5^{th}$ and higher harmonics in this case for finding the optimum $s_1(n)$. Thus, c(0)=c(1)=0 for the case of $s_1(n)$, since we do not want to minimize the fundamental or $3^{rd}$ harmonics.

FIG. 10 shows the plots of the upper 1136 and lower 1137 bounds, $v_{ub1}(n)$ and $v_{lb1}(n)$, respectively, which constrain the optimization procedure. The additional "1" in the subscript notation here indicates the upper and lower bounds are for the data-1 waveform. FIG. 10A shows the prototype waveform $p_1(n)$ 1132 again for reference. FIG. 10B shows the upper bound $v_{ub1}(n)$ 1136 and FIG. 10C shows the lower bound $v_{lb1}(n)$ 1137. These bounds on the solution accommodate the Gen2 ripple, undershoot, and overshoot requirements. The upper bound waveform 1136 is defined as $$v_{ub1}(n) = \begin{cases} p_1(n), & p_1(n) \leq 0.9 \\ 1.05, & \text{otherwise} \end{cases}$$

This definition preserves the rise and fall time characteristics of the sinusoid, since per the Gen2 specifications the rise and fall times are defined in terms of the waveform's transitions between 10% and 90% of the full-scale amplitude. Similarly, the lower bound 1137 is defined as $$v_{lb1}(n) = \begin{cases} p_1(n), & p_1(n) \leq 0.95 \\ 0.95, & \text{otherwise} \end{cases}$$

which again maintains the rise and fall times while allowing for undershoot and ripple. Note that this embodiment defines the upper and lower bounds in terms of the full 5% ripple allowed in the Gen2 specification. Alternative embodiments could define the bounds using less than the maximum ripple. Furthermore, alternative embodiments could define the bounds using more than the maximum ripple if strict compliance to the specification was not a concern. The quadratic programming optimization algorithm is a highly efficient means of finding this optimum solution. The Matlab Optimization Toolbox by the Mathworks, Inc. provides a flexible implementation of the quadratic programming algorithm with which to create the final waveforms.

FIG. 11 illustrates the resulting waveform $s_1(n)$ 1130. FIG. 11A shows the full quarter wave symmetric waveform $h_1(n)$ 1134. FIG. 11B shows the upper bound $v_{ub1}(n)$ 1136 and FIG. 11C shows the lower bound $v_{lb1}(n)$ 1137. FIG. 11D shows the resulting optimized waveform $s_1(n)$ 1130. The procedure for creating the RTCAL and TRCAL signals are very similar to the technique used for $s_1(n)$. To generate an RTCAL signal of length 2.933 tari, the starting point is the prototype signal $$p_{RTCAL}(t) = \begin{cases} \sin(\pi t/\tau), & 0 \leq t < \tau/2 \\ 1, & \tau/2 \leq t < 2.433\tau \\ \sin(\pi(t-1.933\tau)/\tau), & 2.433\tau \leq t < 2.933\tau \end{cases}$$

The result is shown in FIG. 12. FIG. 12A shows the full quarter wave symmetric waveform $h_{RTCAL}(n)$ 1154. FIG. 12B shows the upper bound $v_{ubRTCAL}(n)$ 1156 and FIG. 12C shows the lower bound $v_{lbRTCAL}(n)$ 1157. FIG. 12D shows the resulting optimized waveform $s_{RTCAL}(n)$ 1150.

To generate a TRCAL signal with length T microseconds one starts with the prototype signal $$p_{TRCAL}(t) = \begin{cases} \sin(\pi t/\tau), & 0 \leq t < \tau/2 \\ 1, & \tau/2 \leq t < T - \tau/2 \\ \sin(\pi(t-T+\tau)/\tau), & T - \tau/2 \leq t < T \end{cases}$$

The TRCAL signal length together with the commanded divide ratio tells the tag what subcarrier frequency to backscatter modulate its response with. For example, a TRCAL with length T=66.6 microseconds yields a 320 KHz tag subcarrier frequency when commanding a divide ratio of 64/3 to the tags. The result for this example with 12.5 microsecond tari is shown in FIG. 13. FIG. 13A shows the full quarter wave symmetric waveform $h_{TRCAL}(n)$ 1164. FIG. 13B shows the upper bound $v_{ubTRCAL}(n)$ 1166 and FIG. 13C shows the lower bound $v_{lbTRCAL}(n)$ 1167. FIG. 13D shows the resulting optimized waveform $s_{TRCAL}(n)$ 1160. These waveforms satisfy the time domain constraints of the Gen2 protocol while obtaining high spectral efficiency. The principal idea is that the rising and falling edges of the data-0, data-1, RTCAL, and TRCAL waveforms be constructed using segments of the $\sin(\pi t/\tau)$ signal.

The delimiter signal requires further explanation. The prototype waveform is $$p_{del}(t) = \begin{cases} 1, & 0 \leq t < 3\tau \\ (1 + \cos(\pi(t-3\tau)/\tau))/2, & 3\tau \leq t < 4\tau \\ 0, & 4\tau \leq t < 4\tau + T_{low} \\ (1 - \cos(2\pi(t-4\tau-T_{low})/\tau))/2, & 4\tau + T_{low} \leq t < 4.5\tau + T_{low} \\ 1, & 4.5\tau + T_{low} \leq t < 4.5\tau + T_{low} + T_{high} \\ \sin(\pi(t - T_{del} + \tau/2)/\tau), & 4.5\tau + T_{low} + T_{high} \leq t < T_{del} \end{cases}$$

where $T_{del} \equiv 5\tau + T_{low} + T_{high}$ is the duration of the complete delimiter waveform, $T_{low}$ is the duration for which $p_{del}(t)=0$, and $T_{high}$ is the duration for which $p_{del}(t)=1$. The prototype $p_{del}(t)$ is made up of six segments each having the following purpose:
(1) the initial segment with duration $3\tau$ where $p_{del}(t)=1$ allows a smooth transition from CW;
(2) the second segment with duration $\tau$ where $p_{del}(t)=(1+\cos(\pi(t-3\tau)/T_F))/2$ provides a smooth falling edge transition for the delimiter pulse;
(3) the third segment with duration $T_{low}$ where $p_{del}(t)=0$ creates the overal 12.5 microsecond pulse width when measured from the 50% falling edge to 50% rising edge per the Gen2 specification;
(4) the forth segment with duration $\tau/2$ where $p_{del}(t)=(1-\cos(2\pi(t-T_1)/\tau))/2$ creates a smooth rising edge for the delimiter;
(5) the fifth segment with duration $T_{high}$ where $p_{del}(t)=1$ has duration which will make the delimiter rising edge to RTCAL rising edge equal exactly tari, as required in the Gen2 specification; and
(6) the final segment with duration $\tau/2$ where $p_{del}(t)=\sin(\pi(t-T_2)/\tau)$ is the normal falling edge with the same functional form as the other symbols leading to an infinitely differentiable signal transition when adjoined with the polarity inverted RTCAL symbol.

One full quarter wave symmetric period $h_{del}(t)$ is shown in FIG. 14 wherein $$h_{del}(t) = \begin{cases} p_{del}(T_{del} - t), & 0 \leq < T_{del} \\ p_{del}(t - T_{del}), & T_{del} \leq t < 2T_{del} \\ -p_{del}(3T_{del} - t), & 2T_{del} \leq t < 3T_{del} \\ -p_{del}(t - 3T_{del}), & 3T_{del} \leq t < 4T_{del} \end{cases}$$

Figure 14A:
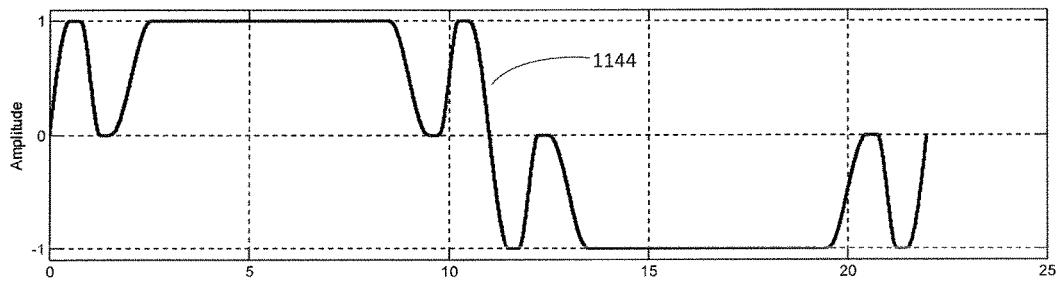
FIG. 14 is a plot of the delimiter waveform result of quadratic programming optimization using the discrete Fourier transform to compute harmonic energy which is to be minimized.
Figure 14B:
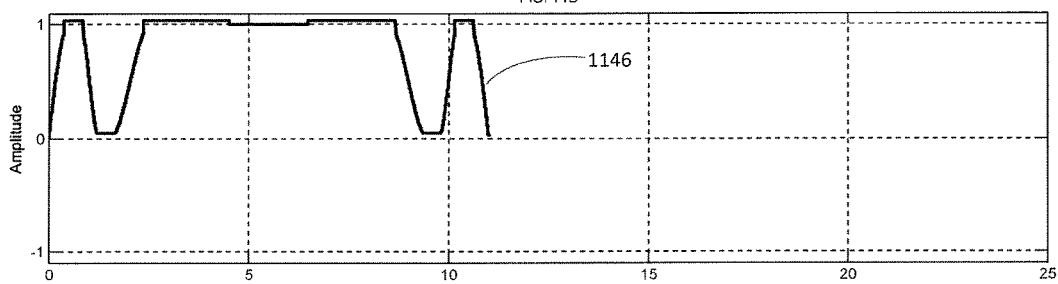
Figure 14C:
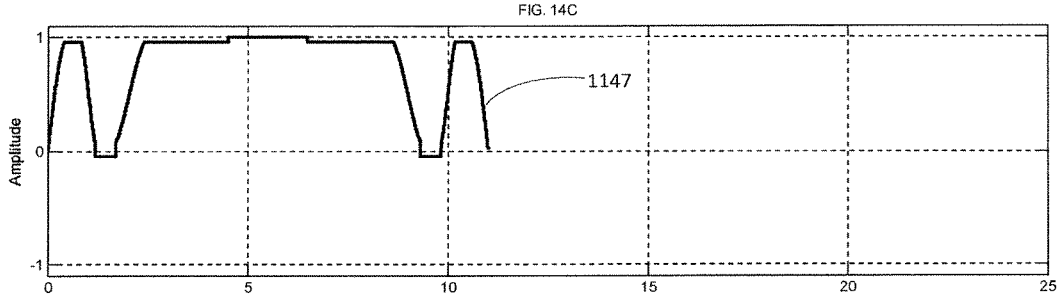
Figure 14D:
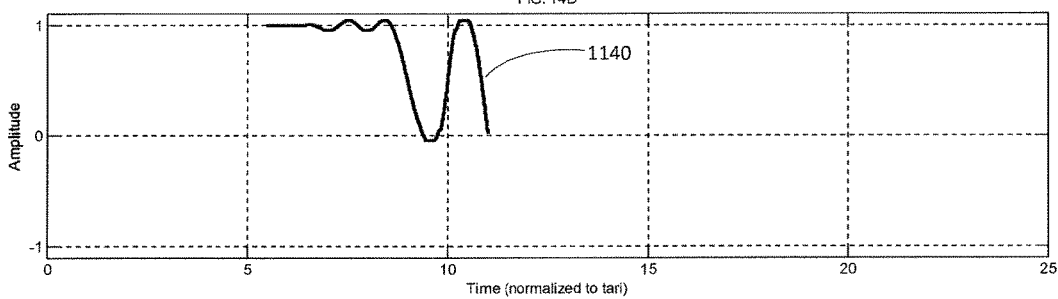
Figure 15A:
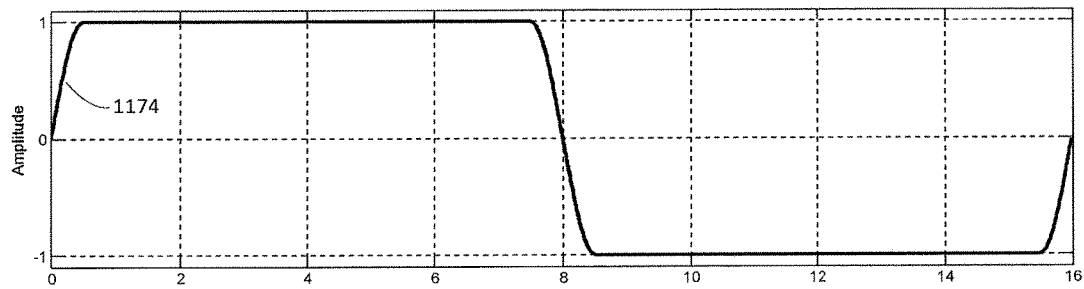
FIG. 15 is a plot of the stop waveform result of quadratic programming optimization using the discrete Fourier transform to compute harmonic energy which is to be minimized.
Figure 15B:
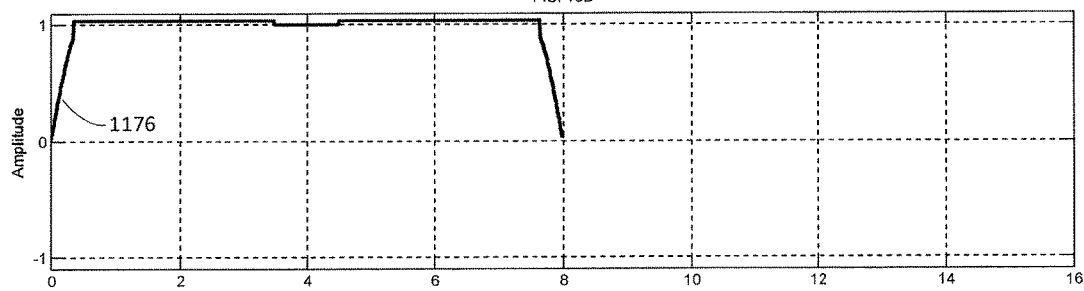
Figure 15C:
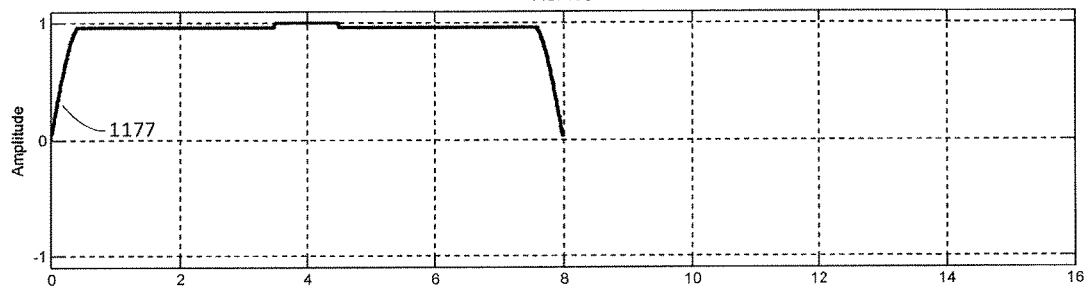
Figure 15D:
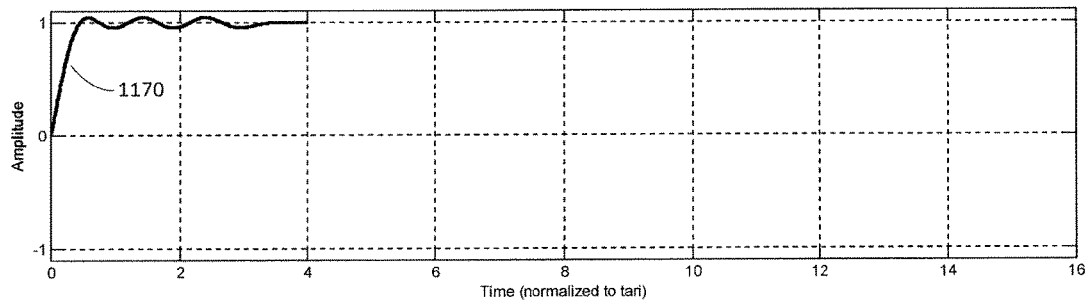

FIG. 14A shows the full quarter wave symmetric waveform $h_{del}(n)$ 1144. FIG. 14B shows the upper bound $v_{ubdel}(n)$ 1146 and FIG. 14C shows the lower bound $v_{lbdel}(n)$ 1147. It can be clearly seen from FIGS. 14B and 14C that the lower and upper bounds are both equal to 1 for a portion of time at the beginning of the delimiter. This constrains the optimization algorithm to taper the delimiter signal smoothly from the CW state, as clearly seen in FIG. 14D. FIG. 14D shows the resulting optimized waveform $s_{del}(n)$ 1140. The upper and lower bounds 1146 and 1147, respectively, create regions in which the optimization procedure can find transitions between the sinusoidal edges and the adjoining constant segments which minimize harmonic frequency content. The half wave and quarter wave symmetry is clearly visible in FIG. 14A. The optimized delimiter $s_{del}(t)$ 1140 can be seen as the second quarter wave, and will be illustrated again in FIG. 16 below. Note that the lower and upper bounds 1146 and 1147, respectively, for the delimiter have several regions including both around where $p_{del}(t)=0$ and $p_{del}(t)=1$ which allow ripple.

The stop waveform is necessary to transition the modulated RFID reader command signal back to continuous wave (CW) so that the tags can backscatter modulate their responses onto the CW RF carrier. The prototype stop waveform is defined as $$p_{stop}(t) = \begin{cases} \sin(\pi t/\tau), & 0 \leq t < \tau/2 \\ 1, & \tau/2 \leq t < 4\tau \end{cases}$$

The first segment provides the normal edge with the same functional form as the other symbols which provides an infinitely differentiable signal transition when adjoined to the preceding polarity inverted data-0 or data-1 symbol. The second segment provides a region with which to settle to CW. Normally the stop waveform will be followed by a sequence of CW waveforms 1180, with $s_{CW}(t)=1$, for $0 \leq t < \tau$. The CW waveform provides RF power to the tags (for passive tags) and a medium onto which the tags modulate their data.

FIG. 15 shows the optimization results using the quarter wave quadratic programming technique with the $s_{stop}(t)$ result 1170 being the first quarter wave. FIG. 15A shows the full quarter wave symmetric waveform $h_{stop}(n)$ 1174. FIG. 15B shows the upper bound $v_{ubstop}(n)$ 1176 and FIG. 15C shows the lower bound $v_{lbstop}(n)$ 1177. It can be clearly seen from FIGS. 15B and 15C that the lower and upper bounds are both equal to 1 for a portion of time at the end of the stop waveform. This constrains the optimization algorithm to taper the stop signal smoothly to the CW state, as clearly seen in FIG. 15D. FIG. 15D shows the resulting optimized waveform $s_{stop}(n)$ 1170. The upper and lower bounds, 1176 and 1177 respectively, allow the optimization procedure to generate a transition to CW.

FIG. 16 is a plot of a complete Gen2 command using the embodiments described herein. For clarity, the signals shown in FIG. 16 do not include linear or nonlinear predistortion. The command illustrated has data payload "0, 0, 1, 0", which is a Gen2 QueryRep command for session 2. Referring to FIG. 16A, the baseband signal 3010 starts at time t=0 with $s_{cw}(t)$ 1180. Commands start from a continuous wave state. The command then begins with a $s_{del}(t)$ 1140. Note that the polarity generation 1194 does not invert the waveform polarity for a delimiter or CW symbol. Note that in the Gen2 specification the frame sync is defined as a delimiter, a data-0, and an RTCAL symbol. Those skilled in the art will recognize that the frame sync data-0 is contained in the delimiter waveform for the embodiments described herein. Alternative embodiments of the invention could define the frame sync data-0 explicitly as a separate waveform without departing from the spirit and scope of this disclosure.

Continuing with the example command 3010 in FIG. 16A, the delimiter is followed by an RTCAL symbol. The RTCAL waveform is inverted by the polarity generation 1194 to produce an inverted RTCAL waveform 1151, $$-s_{RTCAL}(t).$$

The four payload data waveforms follow with each successive signal inverted relative to the previous: data-0, $s_0(t)$ 1120; inverted data-0, $-s_0(t)$ 1121; data-1, $s_1(t)$ 1130; and inverted data-0, $-s_0(t)$ 1121. The command is ended with a stop waveform $s_{stop}(t)$ 1170. The stop waveform transitions to the CW waveform $s_{cw}(t)$ 1180. The CW waveform is typically repeated while the reader 1000 waits for a backscatter or load modulation reply from one or more tags.

Figure 17:
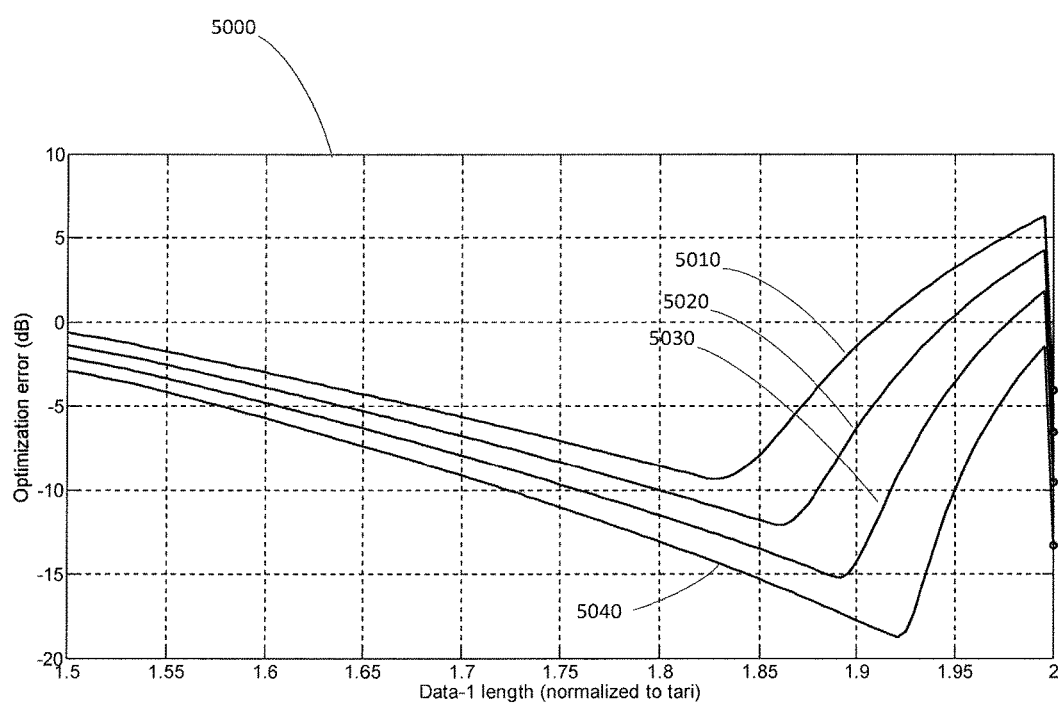
FIG. 17 is a plot of the optimization error energy verses data-1 length showing the pronounced minimum between data-1 length=1.8×tari and data-1 length=1.95×tari, depending on allowed optimization ripple, with an example embodiment of the invention.

The function of the polarity generator 1194 from FIG. 5 is apparent in FIG. 16. The initial CW has polarity +1, which is maintained during the delimiter since as stated previously the delimiter and the CW symbols do not cause the polarity generator to flip polarity. However, the rest of the symbol waveforms each reverse polarity. The tag cannot detect the phase reversals but decodes commands using the envelope of the modulated RF carrier, which is illustrated as 3020 in FIG. 16B. The example embodiment described here uses a data-1 length of about 1.933 tari. This value was obtained by a search across valid values of data-1 length from 1.5 tari to 2.0 tari, as shown in FIG. 17. The optimization procedure was carried out to determine what length produces the lowest levels of harmonic energy, and conversely the best spectral occupancy. The optimization was carried out for several levels of allowed ripple, as specified by the lower and upper bound functions previously described. The plot 5000 in FIG. 17 shows curve 5010 for 3.5% allowed ripple, curve 5020 for 4.0% ripple, curve 5030 for 4.5% ripple, and 5040 for 5.0% ripple. As shown in FIG. 17, the optimization error slowly decreases as data-1 length is increased until it reaches a minimum somewhere between 1.8 tari and 1.95 tari, depending on the allowed ripple level. After this minimum the error rises more sharply, although there is another very sharp local minimum at 2 tari. These local minimums at 2 tari are marked by small circles in plot 5000. However, even this local minimum error value at 2 tari is approximately 4 dB higher than the global minimum value between 1.8 and 1.95 tari. The example embodiments illustrated in this specification have used 1.933 tari and 5% ripple. Note that generating any data-1 length between 1.8 and 1.95 tari is not practical using a Nyquist filtering signal generation scheme as shown in FIG. 4, but is easily accommodated using the technique disclosed herein.

Figure 18:
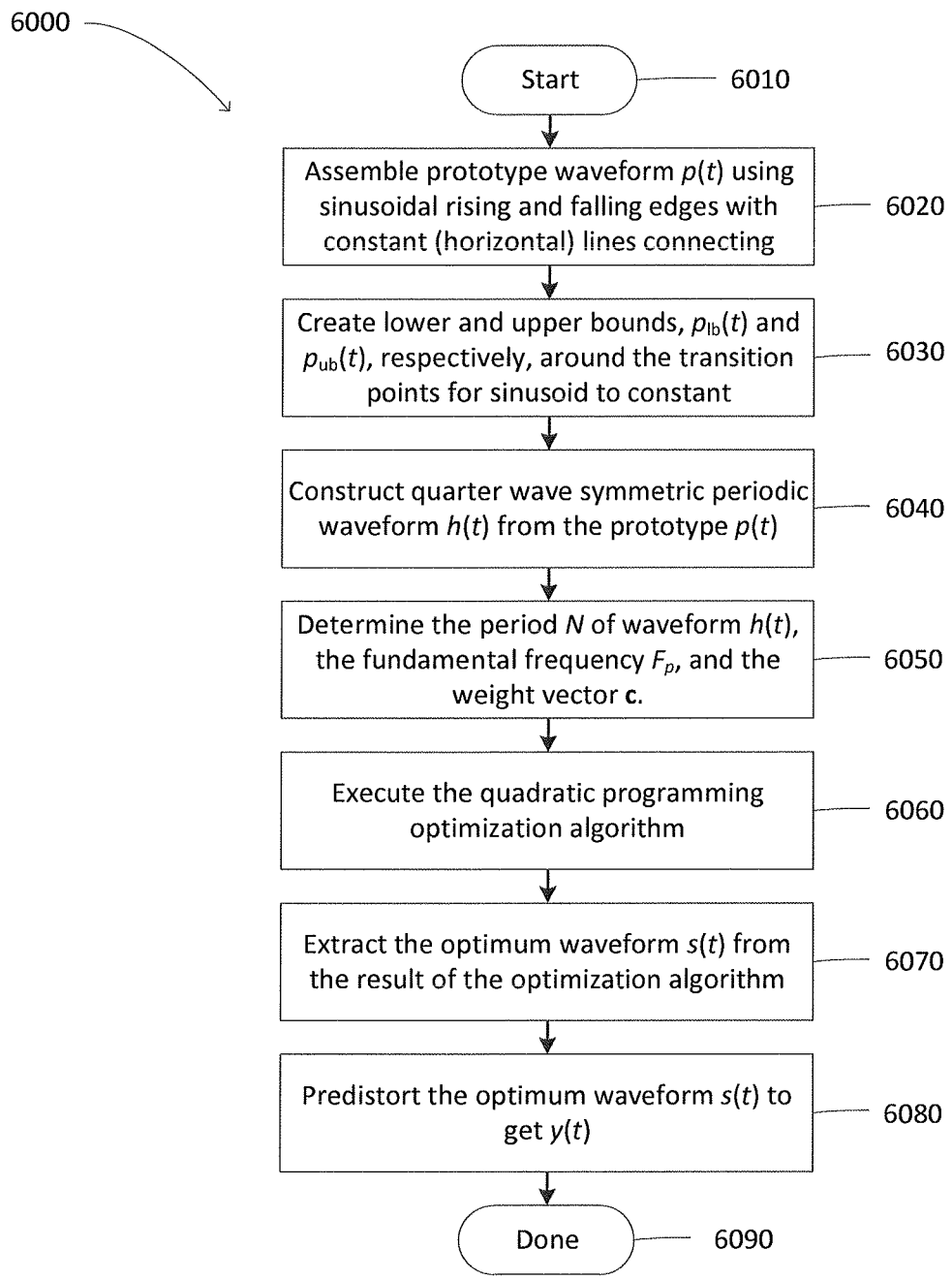
FIG. 18 is a flowchart to illustrate the overall procedure of generating the RFID transmit signal using the technique of embodiments of the invention.

FIG. 18 shows a flowchart illustrating process 6000 for generating the transmit waveforms. Start the process at step 6010. At step 6020 a prototype waveform is assembled using sinusoidal rising and falling edges with constant segments interconnecting the edges. The edges should satisfy the rise and fall time specifications of the protocol and the edge-to-edge timing should satisfy the pulse width and other signal timing specifications. At step 6030 the lower and upper bounds are created so that the rise and fall times are preserved while providing freedom to the optimization algorithm to improve the spectral occupancy by adding overshoot and ripple to the sinusoid-to-constant transition. The lower and upper boundaries should constrain the ripple so as not to exceed the maximum allowable ripple in the protocol specification. At 6040 a periodic waveform is constructed from the prototype waveform, the periodic waveform having quarter wave symmetry. In step 6050 the period and fundamental frequency are determined for the quarter wave symmetric periodic waveform. From this the optimization weight vector is created. The weighting is zero for the fundamental and lower harmonics which are within the pass band. The stop band weights are a design parameter. An example weight function was previously discussed. At step 6060 the optimization algorithm is executed. In this case the quadratic programming algorithm is used. At 6070 the optimum waveform is extracted from the optimization solution. At 6080 the nonlinear and linear predistortion are applied to the optimum waveform to produce the run time waveform. At 6090 the procedure is done. It may be said herein that predistortion is applied to substantially undistorted waveforms. The phrase "substantially undistorted" is merely meant to refer to waveforms without the predistortion applied.

FIG. 19 shows a flowchart of an example embodiment that could be implemented in software such as executed by a microprocessor in an RFID system. The process 7000 starts at step 7010 where it proceeds to step 7012. At step 7012 the system determined if a new command x(k) 1190 is to be sent. If no new command is ready, then at 7014 the waveform pointer is initialized to the CW waveform and the waveform length is initialized to the length of the CW waveform at 7016. The process continues to step 7042. If at step 7012 there is a new command, then the process continues to 7020 where the next symbol is loaded from the command buffer. The polarity is then set as follows. At step 7022 the symbol is checked to see if it is a CW symbol. If not then at step 7024 the symbol is check to see if it is a delimiter. If the symbol is neither a CW nor a delimiter, then at step 7026 the current polarity state is inverted. On the other hand, if the next symbol is a CW or a delimiter the process skips ahead to step 7032 so that the polarity state is not inverted. Steps 7022 through 7026 together form the polarity generation algorithm in this example Continuing at step 7032 of FIG. 19, the memory pointer is loaded for the start of the next selected waveform and at step 7034 the length of the next select waveform is loaded into the counter. Starting at step 7042 the next selected waveform is transferred to the DAC. At step 7042 the next waveform sample is read from memory at the pointer and at 7044 the polarity is set depending on the current polarity state. At 7046 the polarity-adjusted sample is written to the DAC and at 7050 the waveform sample counter is decremented. At step 7052 the counter is checked to see if the current waveform is finished. If there are more samples the process loops back to step 7042, while if the waveform has been completely transferred the process continues to 7060, where it checks to see if there are more command symbols in the command buffer. If there are more command symbols the process loops back to 7020. On the other hand, if there are no more symbols in the command the process loops back to step 7012, wherein the system sends CW until a new command arrives.

Steps 7032 through 7052 perform the function of the MUX 1192 in FIG. 5. The commands x(k) 1190 are buffered in microprocessor memory and may be sent by another process or thread within the same microprocessor or by a another processor responsible for generating air interface commands. The process 7000 transfers samples to the transmit DAC. No flow control is shown since this is dependent on the embodiment. Some implementations will use DMA, other implementations may use interrupt requests.

The example embodiments disclosed herein consider 12.5 microsecond tari with 1.933 tari data-1 length, and a 66.6 microsecond TRCAL symbol. The pass-band was considered to be 100 KHz for the purposes of optimizing the waveforms. These parameters should not be considered limiting; other embodiments are possible without deviating from the spirit and scope of this disclosure. The example embodiments disclosed herein are applied to Gen2 PR-ASK modulation. Those with ordinary skill in the art should be able to apply these techniques to Gen2 DSB-ASK or to Manchester encoded modulation, both of which are also commonly used for RFID reader modulation.

The example devices and methods in this disclosure can achieve FCC and ETSI regulatory compliance with low computational complexity. In some embodiments, a general-purpose processor such as a DSP, microcontroller or microprocessor is used and non-transitory firmware, software, or microcode can be stored in a tangible storage medium that is associated with the device. Any such device may be referred to herein as a "processor" or a "microprocessor." Such a medium may be a memory integrated into the processor, or may be a memory chip that is addressed by the controller to perform control functions. Such firmware, software or microcode is executable by the processor and when executed, causes the processor to perform its control functions. Such firmware or software could also be stored in or on a tangible medium such as an optical disk or traditional removable or fixed magnetic medium such as a disk drive used to load the firmware or software into an RFID system.

It should be noted that any data and information necessary to support the execution of instructions for any embodiment of the invention can be placed in a removable storage medium as well. An example is the signal tables previously discussed with reference to FIG. 5. These could be stored on a disk as well, especially for development purposes or for maintenance and update purposes. Such a storage medium may be accessed either directly or over a network, including the Internet.

Although specific embodiments have been illustrated and described herein, those of ordinary skill in the art appreciate that any arrangement which is calculated to achieve the same purpose may be substituted for the specific embodiments shown and that the invention has other applications in other environments. It is clear that digital interpolation could be applied between the waveform synthesis implementation and the transmitter DACs to further increase the waveform sampling rate beyond that used to store in DSP memory 1101. The waveform optimization algorithm could use quarter wave symmetry to reduce optimization complexity, but may use half wave, full wave, or any other variant to find a spectrally optimized waveform. Some combinations or sampling rate and waveform duration may not create quarter wave symmetric sampled waveforms, so full DFT computations may be necessary. This application is intended to cover any adaptations or variations of the present invention. The following claims are in no way intended to limit the scope of the invention to the specific embodiments described herein.

The invention claimed is:

1. A radio frequency identification (RFID) system comprising:
   a storage medium comprising a plurality of stored waveforms, each stored waveform representing a respective RFID symbol usable in a sequence of RFID symbols according to an RFID protocol; and
   a polarity generator to selectively impart a polarity to each stored waveform based on the RFID protocol and the respective RFID symbol represented by the corresponding one of the stored waveforms to assemble the sequence of RFID symbols.

2. The RFID system of claim 1 further comprising:
   an RF source to produce a carrier wave; and
   an RF amplifier connected to the RF source and the polarity generator for transmitting the sequence of RFID symbols as output from the polarity generator modulated onto the carrier wave to synthesize an RFID transmitter waveform.

3. The RFID system of claim 2 wherein the stored waveforms include at least one of linear and nonlinear predistortion applied to substantially undistorted waveforms.

4. The RFID system of claim 3 wherein the stored waveforms are represented in Cartesian coordinates for use in a direct conversion transmitter.

5. The RFID system of claim 4 further comprising a modulator connected to the polarity generator, the RF source and the RF amplifier to form the direct conversion transmitter and produce the RFID transmitter waveform as an amplitude modulated RF signal.

6. The RFID system of claim 3 wherein the stored waveforms are represented in polar coordinates for use in a polar modulation transmitter.

7. The RFID system of claim 6 further comprising a phase shifter connected to the polarity generator, the RF source and the RF amplifier to form the polar modulation transmitter and produce the RFID transmitter waveform.

8. The RFID system of claim 3 wherein the undistorted waveforms are products of an optimization procedure minimizing spectral occupancy.

9. The RFID system of claim 8 wherein the optimization procedure comprises quadratic programming using a discrete Fourier transform.

10. The RFID system of claim 3 wherein at least some of the RFID symbols in the sequence of RFID symbols comprise a data-1 having length from about 1.8 to about 1.95 type-A reference interval (tari).

11. The RFID system of claim 3 wherein the carrier wave has a frequency selected from high-frequency, ultra-high-frequency, or microwave frequency bands.

12. A method of synthesizing a radio frequency identification (RFID) transmitter waveform, the method comprising:
   repeatedly retrieving, by a processor, a stored waveform from a plurality of stored waveforms, each stored waveform representing a respective RFID symbol usable in a sequence of RFID symbols according to an RFID protocol;

imparting, by the processor, a polarity to each stored waveform, the polarity being selectively set based on the RFID protocol and the respective RFID symbol represented by the stored waveform; and assembling, by the processor, the sequence of RFID symbols each based on the corresponding one of the stored waveforms and the selectively set polarity.

13. The method of claim 12 wherein the stored waveforms include at least one of linear and nonlinear predistortion applied to substantially undistorted waveforms.

14. The method of claim 13 further comprising modulating the sequence of RFID symbols onto a carrier wave to synthesize an RFID transmitter waveform.

15. The method of claim 14 wherein the stored waveforms are represented in Cartesian coordinates for use in a direct conversion transmitter.

16. The method of claim 14 wherein the stored waveforms are represented in polar coordinates for use in a polar modulation transmitter.

17. The method of claim 16 wherein at least some of the RFID symbols in the sequence of RFID symbols comprises a data-1 having from about 1.8 to about 1.95 type-A reference interval (tari) length.

18. The method of claim 17 wherein the carrier wave has a frequency selected from high-frequency, ultra-high-frequency, or microwave frequency bands.

19. Apparatus comprising:
 means for storing a plurality of waveforms;
 means for retrieving a stored waveform from the plurality of waveforms, each stored waveform representing a respective radio frequency identification (RFID) symbol usable in a sequence of RFID symbols according to an RFID protocol;
 means for imparting a polarity to the stored waveform, the polarity being selectively set based on the RFID protocol and the respective RFID symbol represented by the stored waveform; and
 means for assembling the sequence of RFID symbols each based on the corresponding one of the stored waveforms and the selectively set polarity.

20. The apparatus of claim 19 further comprising means for modulating the sequence of RFID symbols onto a carrier wave to synthesize an RFID transmitter waveform.

21. A method of making a radio frequency identification (RFID) system to synthesize a transmitter waveform, the method comprising:
 assembling a prototype waveform using sinusoidal rising and falling edges for each respective RFID symbol from among a plurality of RFID symbols according to an RFID protocol;
 creating lower and upper bounds for the prototype waveform so that rise and fall times are preserved;
 constructing a periodic waveform from the prototype waveform;
 executing an optimization algorithm using the periodic waveform to extract a corresponding run time waveform;
 similarly extracting the corresponding run time waveform for each respective RFID symbol to obtain and store a plurality of run time waveforms in a storage medium; and
 providing a polarity generator to selectively impart a polarity to each run time waveform based on the RFID protocol and the respective RFID symbol represented by the corresponding one of the run time waveforms to assemble a sequence of RFID symbols for the transmitter waveform.

22. The method of claim 21 further comprising applying at least one of linear and nonlinear predistortion to the corresponding run time waveform prior to storing the corresponding run time waveform.

23. The method of claim 22 wherein the optimization algorithm is a quadratic programming algorithm.

* * * * *